US012598848B2

(12) United States Patent
An

(10) Patent No.: US 12,598,848 B2
(45) Date of Patent: Apr. 7, 2026

(54) METHOD FOR MANUFACTURING SEMICONDUCTOR LIGHT EMITTING DEVICE

(71) Applicant: WAVELORD CO., LTD, Suwon-si (KR)

(72) Inventor: Sang Jeong An, Incheon (KR)

(73) Assignee: WAVELORD CO., LTD, Suwon-si (KR)

( * ) Notice: Subject to any disclaimer, the term of this patent is extended or adjusted under 35 U.S.C. 154(b) by 689 days.

(21) Appl. No.: 17/914,349

(22) PCT Filed: Mar. 26, 2021

(86) PCT No.: PCT/KR2021/003798
§ 371 (c)(1),
(2) Date: Sep. 25, 2022

(87) PCT Pub. No.: WO2021/194314
PCT Pub. Date: Sep. 30, 2021

(65) Prior Publication Data
US 2023/0103358 A1     Apr. 6, 2023

(30) Foreign Application Priority Data

Mar. 26, 2020 (KR) ........................ 10-2020-0037119
Jun. 5, 2020 (KR) ........................ 10-2020-0068504
(Continued)

(51) Int. Cl.
*H01L 33/62* (2010.01)
*H10H 20/01* (2025.01)
(Continued)

(52) U.S. Cl.
CPC .......... *H10H 20/857* (2025.01); *H10H 20/01* (2025.01); *H10H 20/018* (2025.01);
(Continued)

(58) Field of Classification Search
CPC ...... H10H 20/857; H10H 20/01; H10H 20/84; H10H 20/018; H10H 20/034; H10H 20/0364
See application file for complete search history.

(56) References Cited

U.S. PATENT DOCUMENTS 5,960,317 A * 9/1999 Jeong ................ H01L 21/76819
438/692
2015/0187993 A1* 7/2015 An ........................ H10H 20/812
438/33

FOREIGN PATENT DOCUMENTS

JP 2005-252222 A 9/2005
JP 2019-208022 A 12/2019
(Continued)

*Primary Examiner* — Victor A Mandala
*Assistant Examiner* — Colleen E Snow
(74) *Attorney, Agent, or Firm* — Han's Law Office

(57) ABSTRACT

The present disclosure relates to a method for manufacturing a semiconductor light emitting device through non-wire bonding, the method comprising the steps of: preparing a semiconductor light emitting die and a support substrate; attaching the semiconductor light emitting die to the support substrate while a second electrical path is exposed, the semiconductor light emitting die being attached such that a conductive bonding structure covering the entire second semiconductor region is tightly bonded to a bonding layer; removing the substrate; and electrically connecting the second electrical path to the remaining semiconductor region among a first semiconductor region and the second semiconductor region through electrical connection through deposition.

4 Claims, 29 Drawing Sheets

(30)        Foreign Application Priority Data

| | | |
|---|---|---|
| Jul. 10, 2020 | (KR) ........................ | 10-2020-0085428 |
| Sep. 4, 2020 | (KR) ........................ | 10-2020-0113288 |
| Sep. 29, 2020 | (KR) ........................ | 10-2020-0127041 |

(51)   Int. Cl.
      *H10H 20/84*       (2025.01)
      *H10H 20/857*      (2025.01)

(52)   U.S. Cl.
      CPC ........... *H10H 20/84* (2025.01); *H10H 20/034*
               (2025.01); *H10H 20/0364* (2025.01)

(56)           References Cited

FOREIGN PATENT DOCUMENTS

| | | | |
|---|---|---|---|
| KR | 10-2001-0017499 | A | 3/2001 |
| KR | 10-1303150 | B1 | 9/2013 |
| KR | 10-2014-0022136 | A | 2/2014 |
| KR | 10-2015-0114240 | A | 10/2015 |
| KR | 10-2016-0050210 | A | 5/2016 |
| KR | 10-2018-0009266 | A | 1/2018 |
| KR | 10-1855063 | B1 | 5/2018 |
| KR | 10-2018-0126773 | A | 11/2018 |
| KR | 10-2020-0009847 | A | 1/2020 |
| KR | 10-2112944 | B1 | 5/2020 |

* cited by examiner

[FIG. 1]
Prior Art
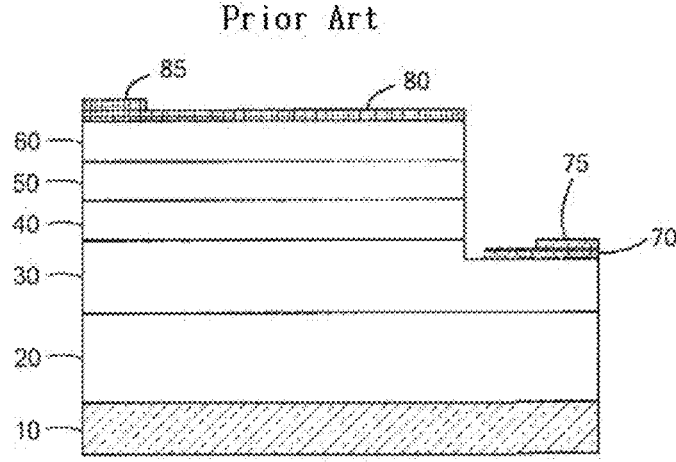
[FIG. 2]
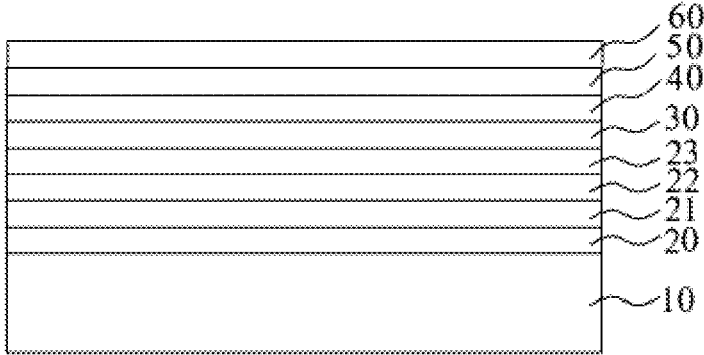

[FIG. 3]
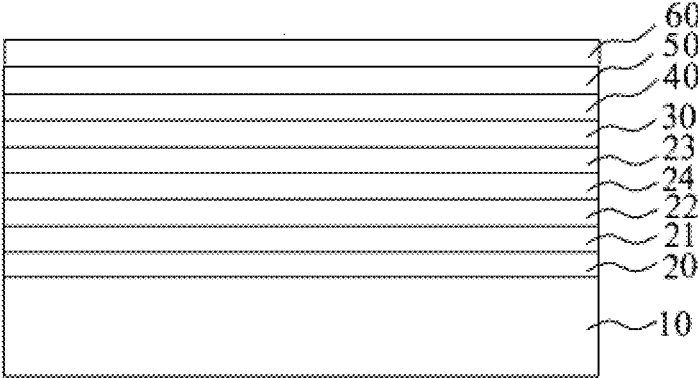
[FIG. 4]
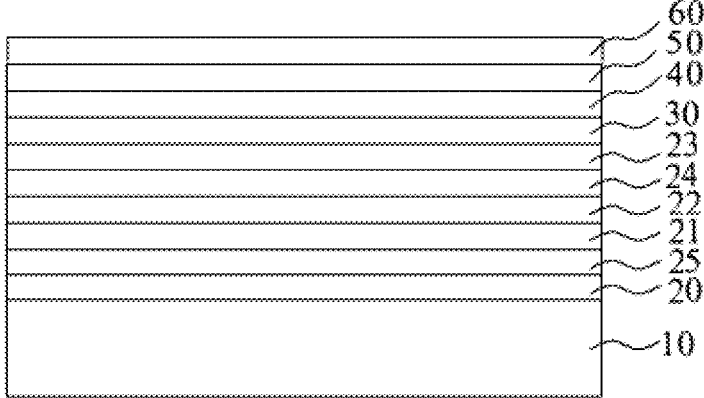

[FIG. 5]
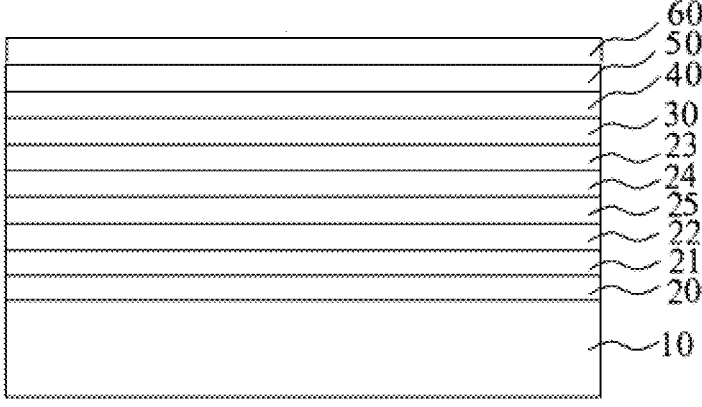
[FIG. 6]
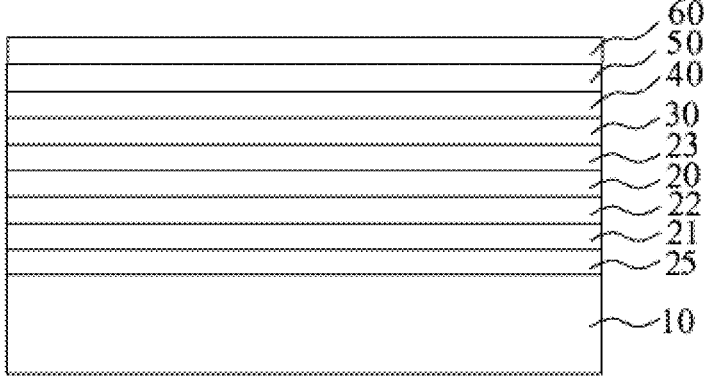

[FIG. 7]
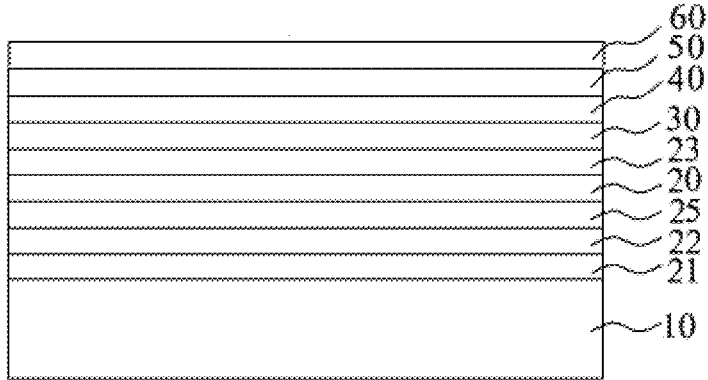
[FIG. 8]
Prior Art
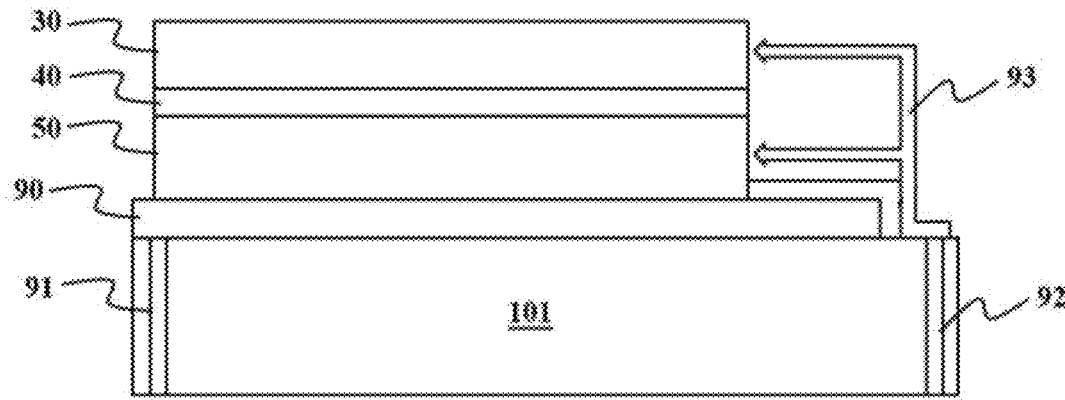

[FIG. 9]
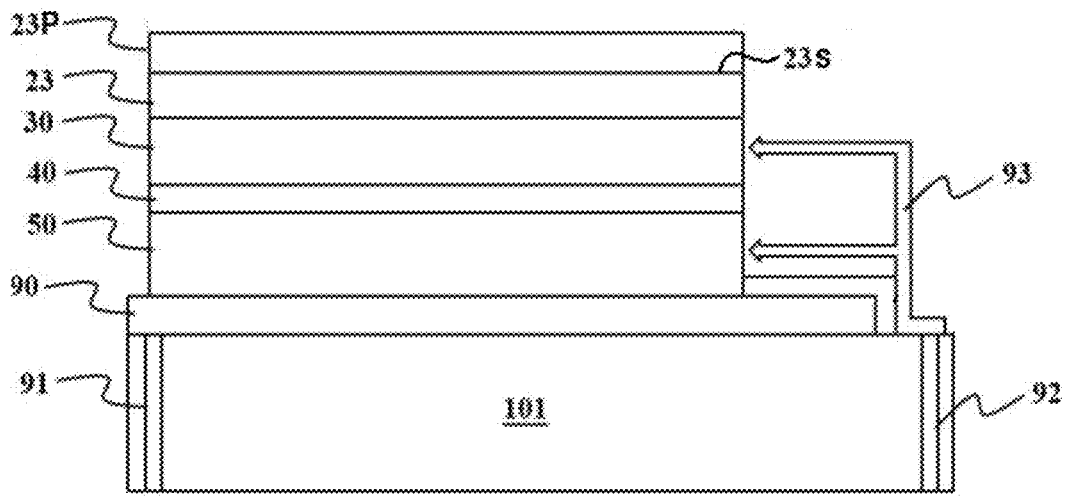
[FIG. 10]
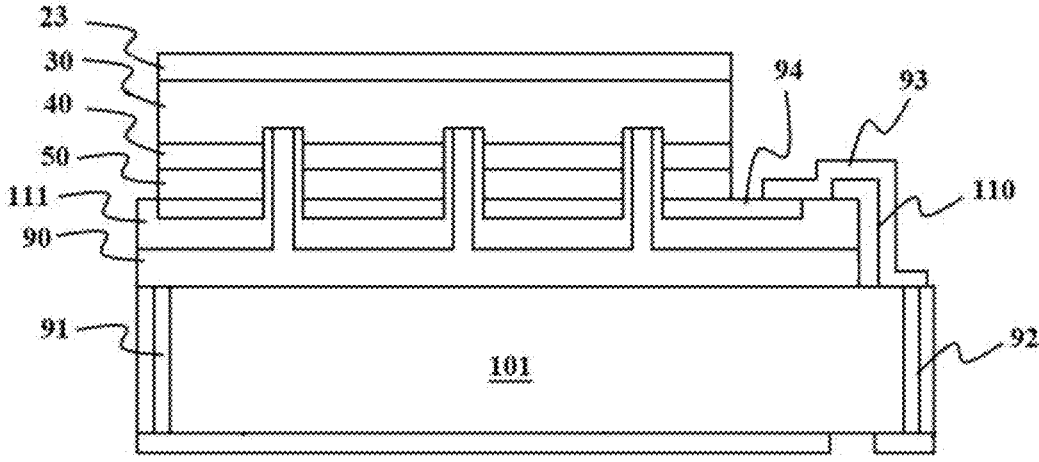

[FIG. 11]
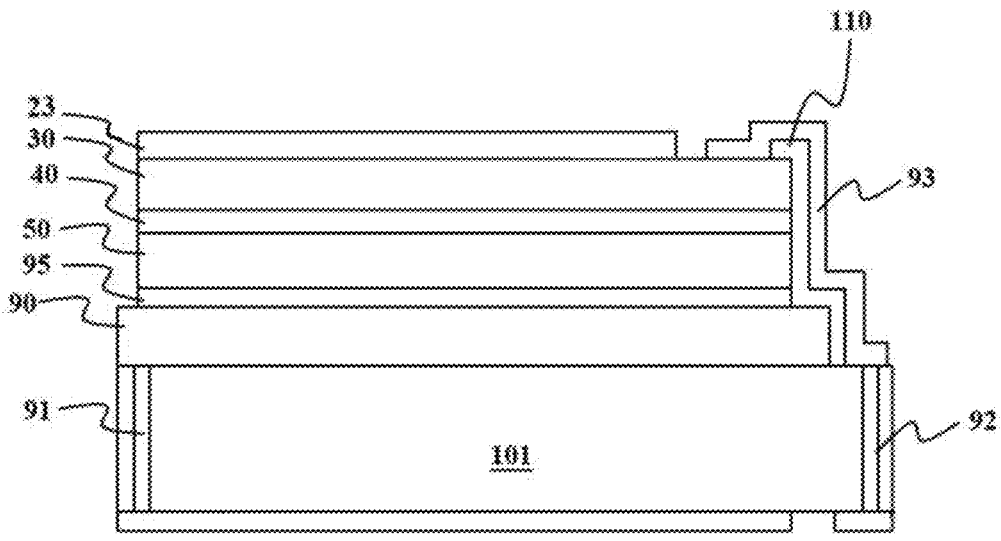
[FIG. 12]
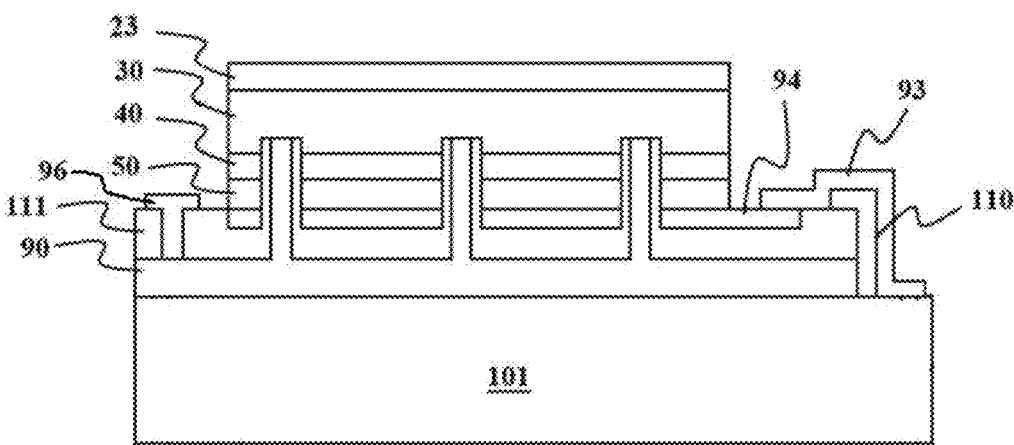

[FIG. 13]
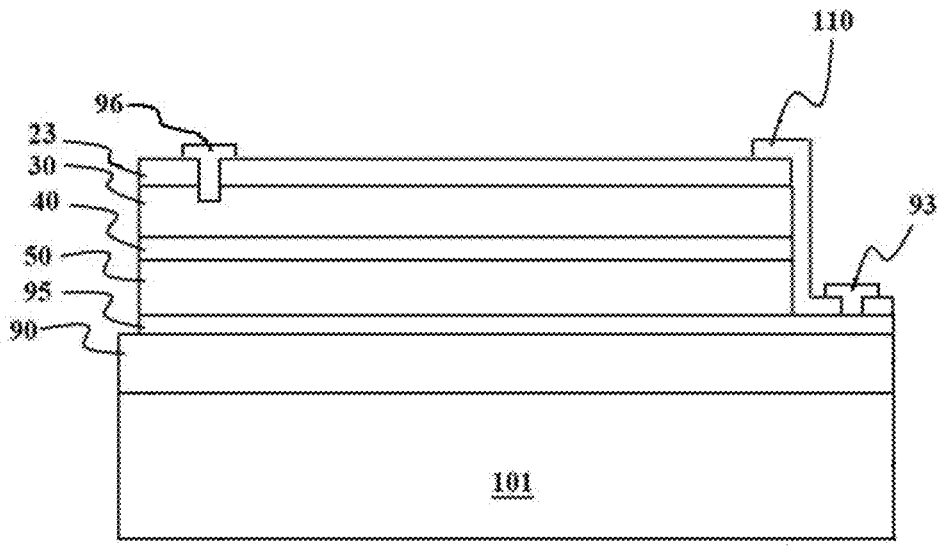
[FIG. 14]
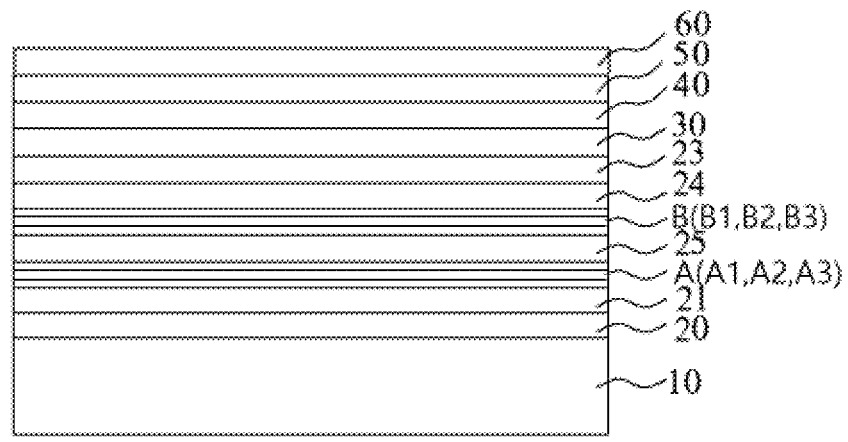

[FIG. 15]
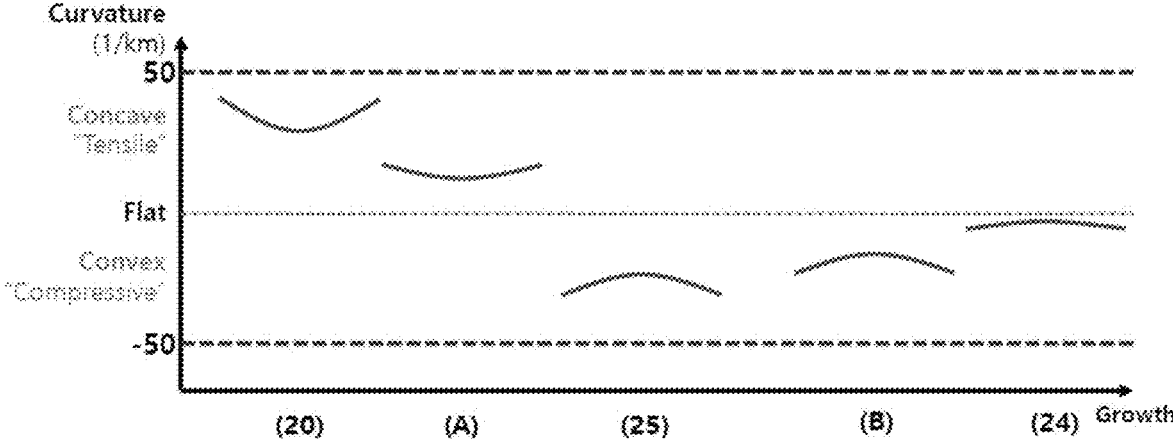
[FIG. 16]
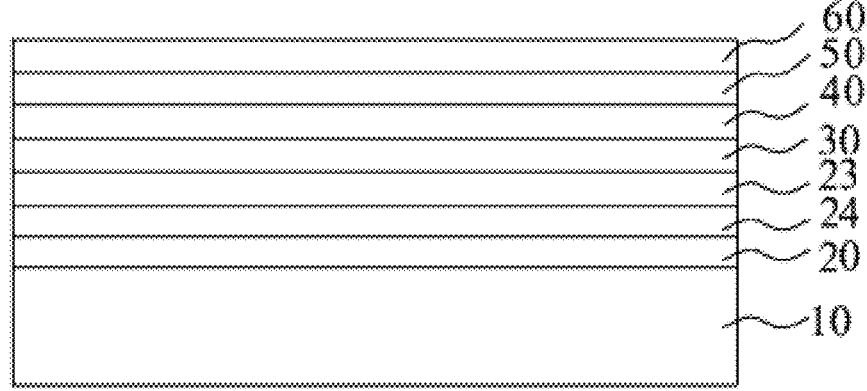

[FIG. 17]
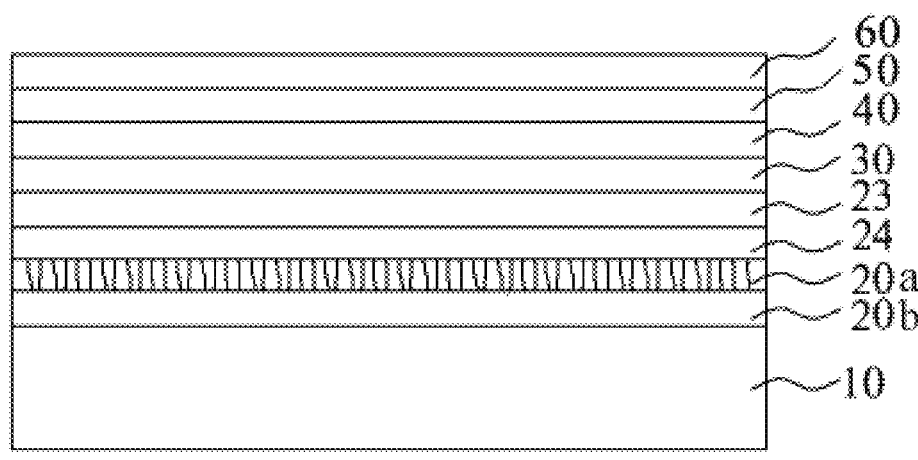

[FIG. 18]
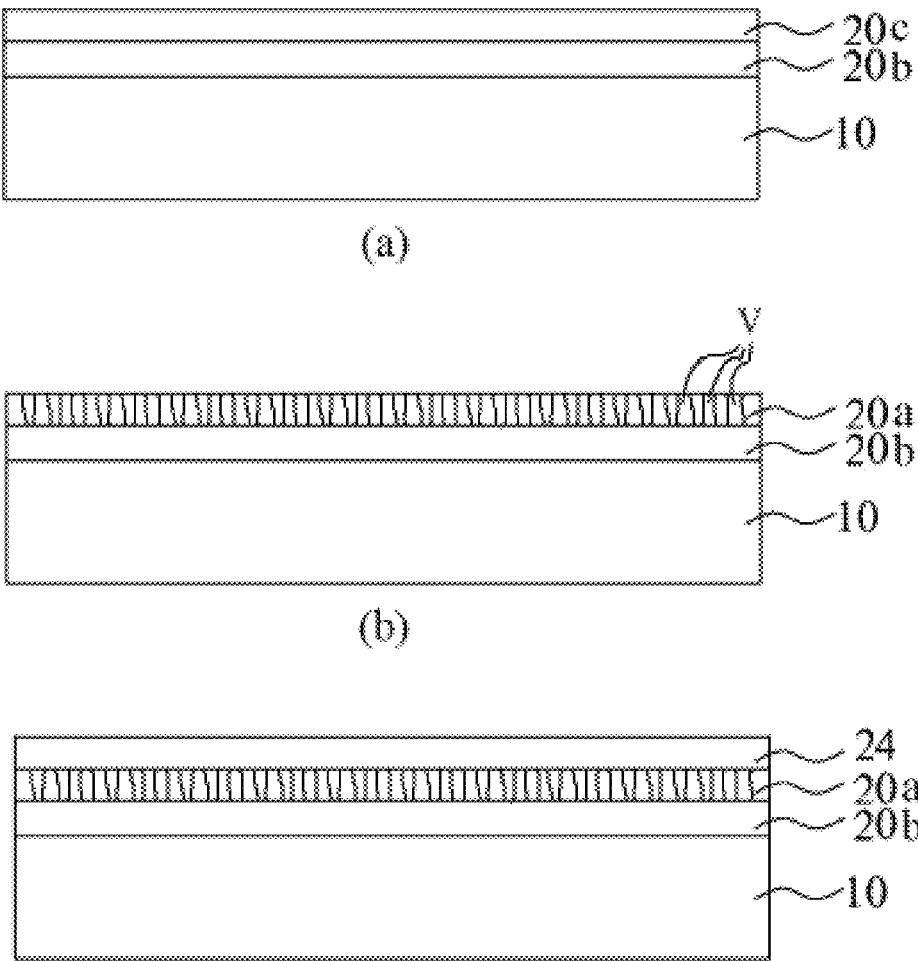
(a)
(b)
(c)

[FIG. 19]
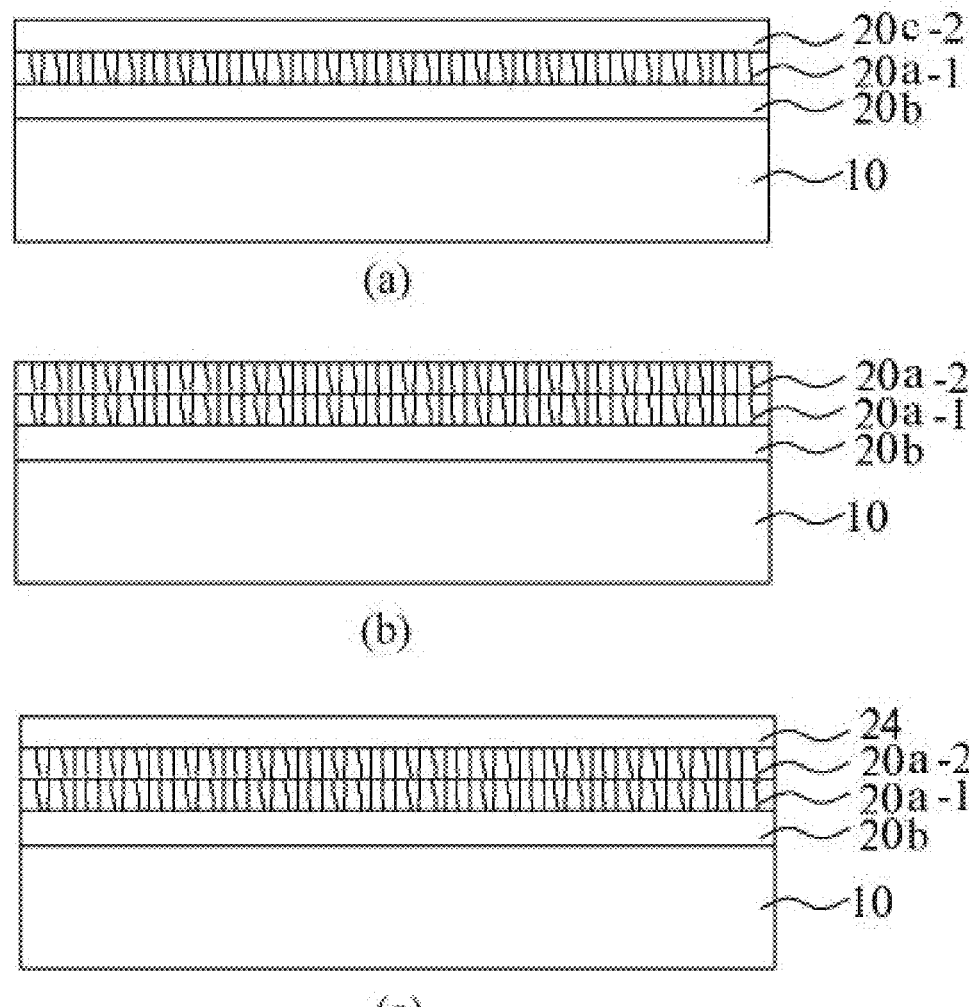
(a)
(b)
(c)

[FIG. 20]
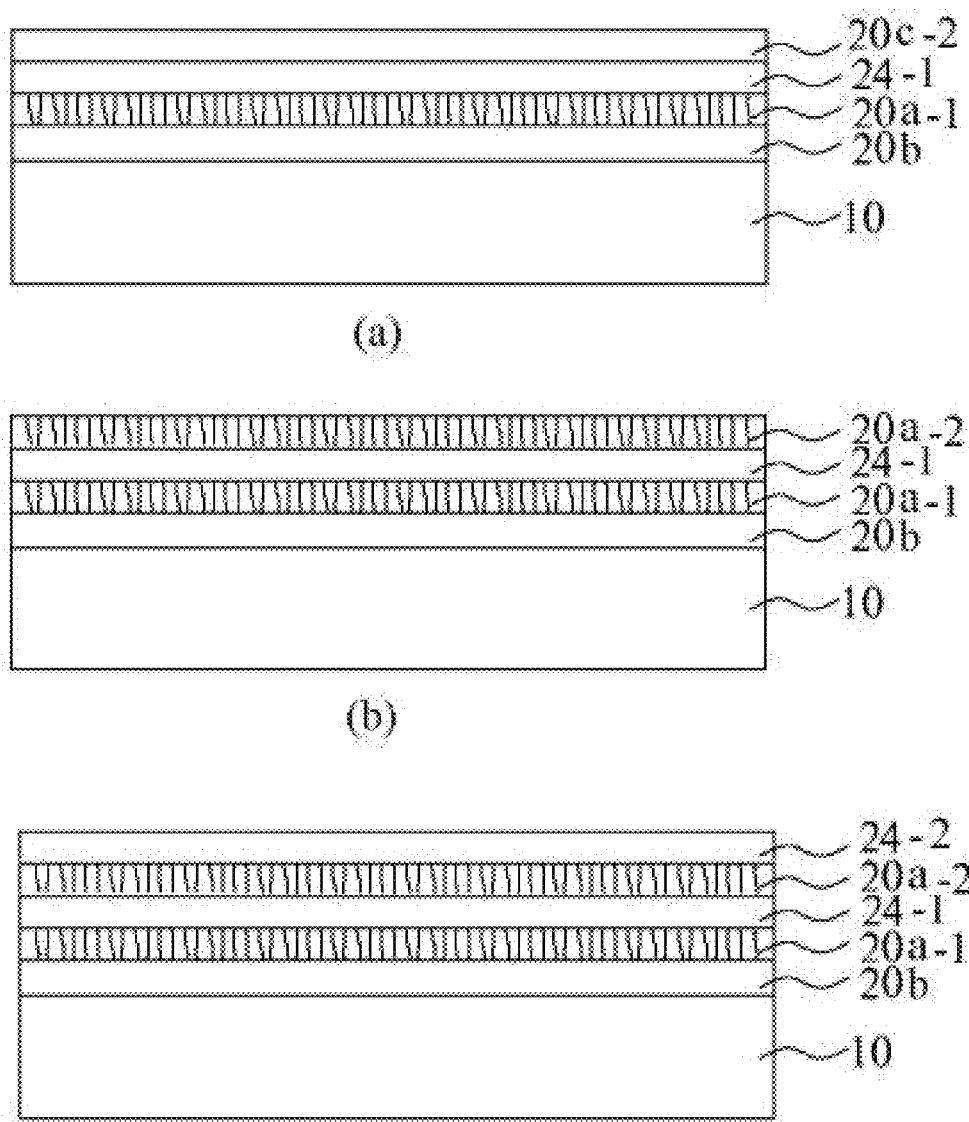
(a)
(b)
(c)

[FIG. 21]
Prior Art
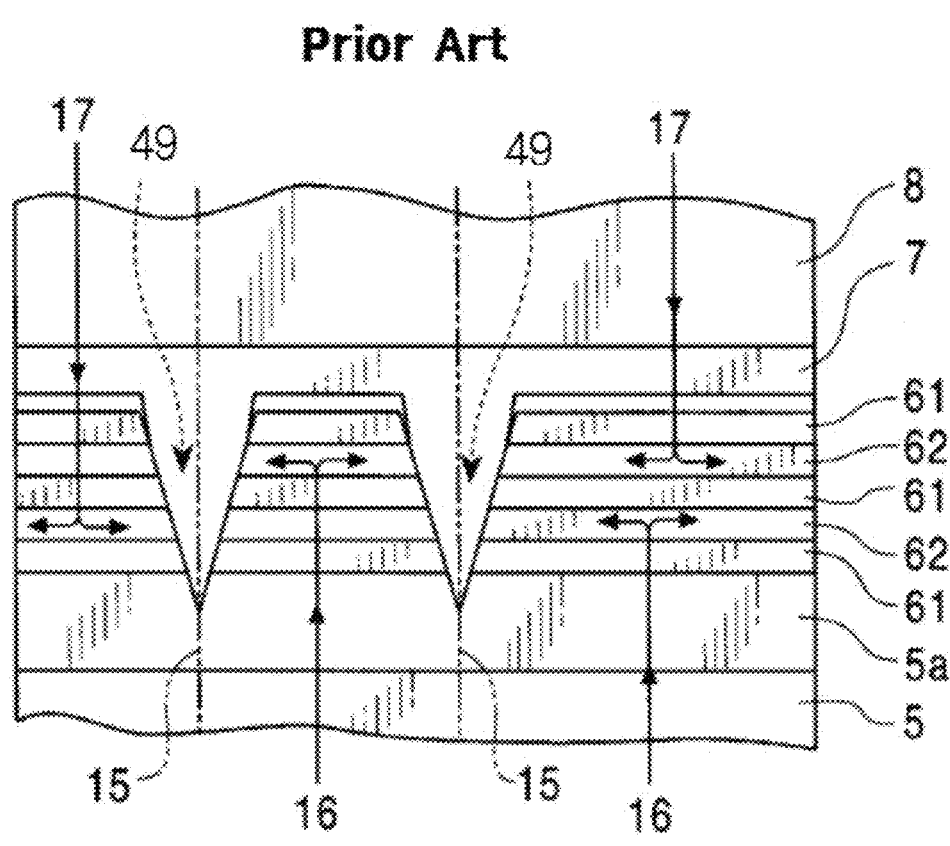

[FIG. 22]
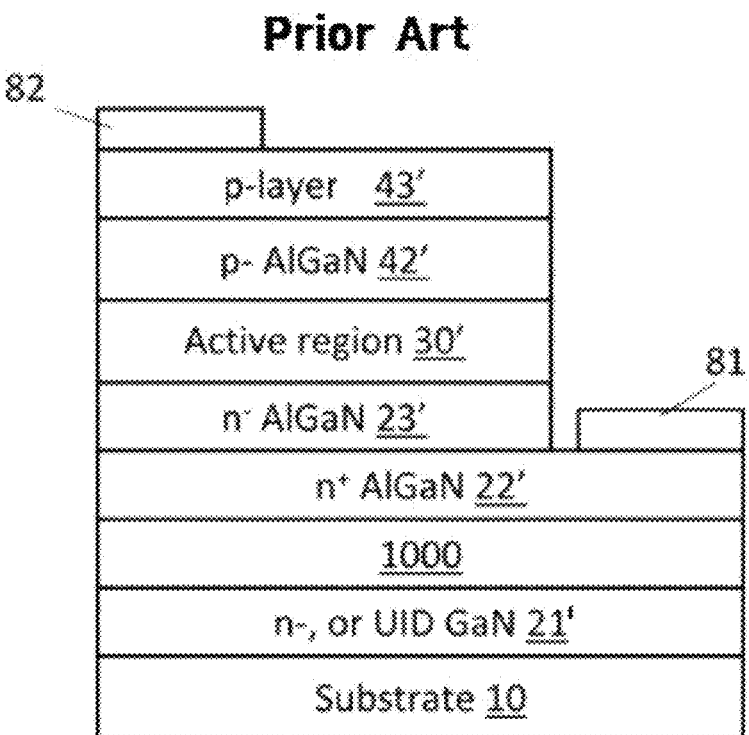
Prior Art

[FIG. 23]
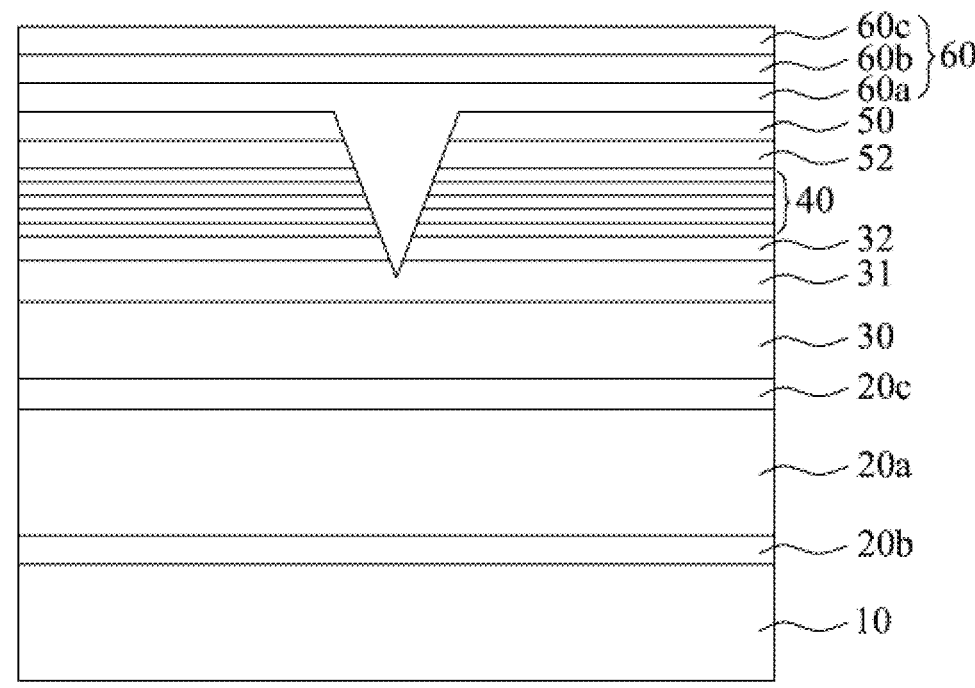

[FIG. 24]
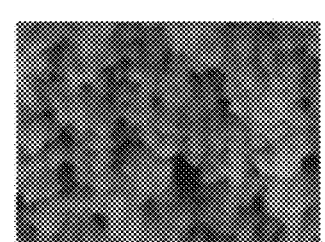
(a)$2*10^{17}/cm^3$
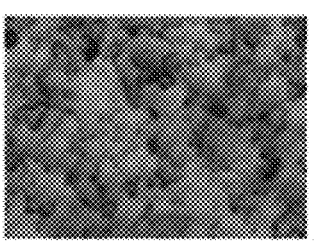
(b)$1*10^{18}/cm^3$
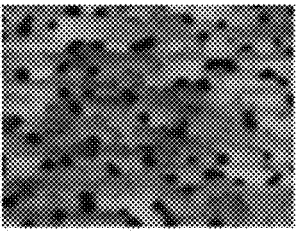
(c)$6*10^{18}/cm^3$
(d)$2*10^{19}/cm^3$

[FIG. 25]
Prior Art
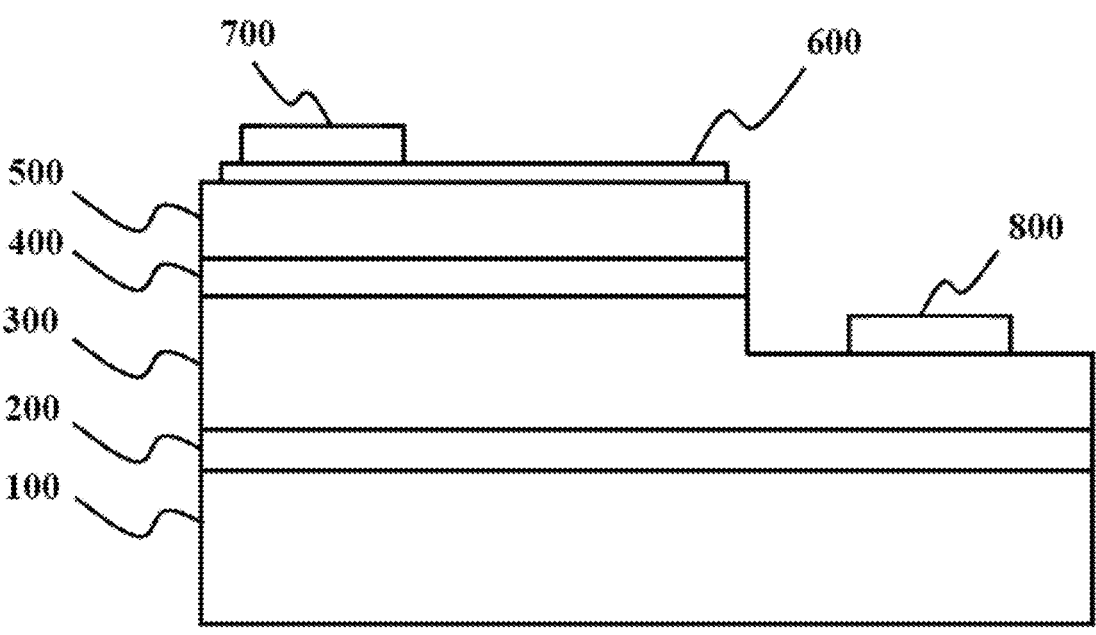
[FIG. 26]
Prior Art
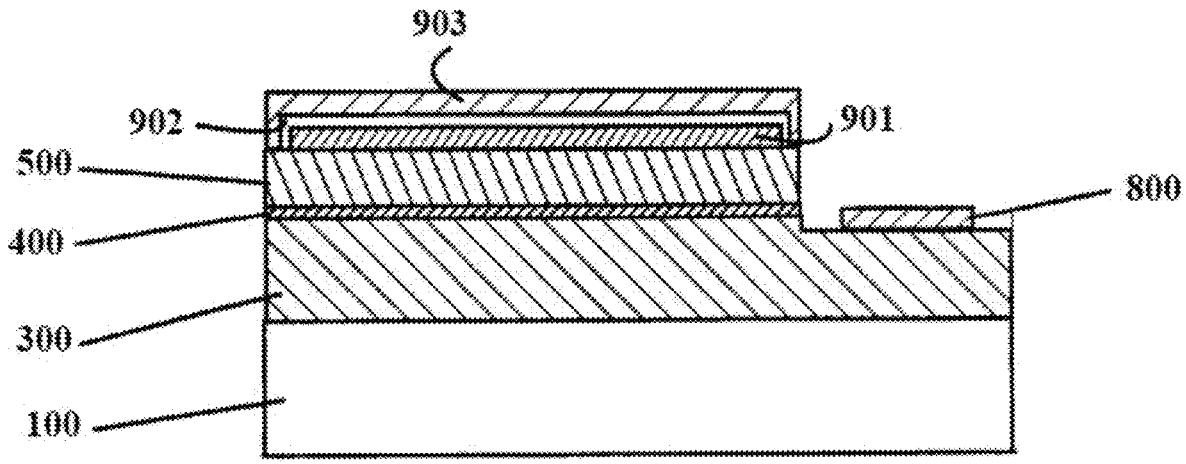

[FIG. 27]
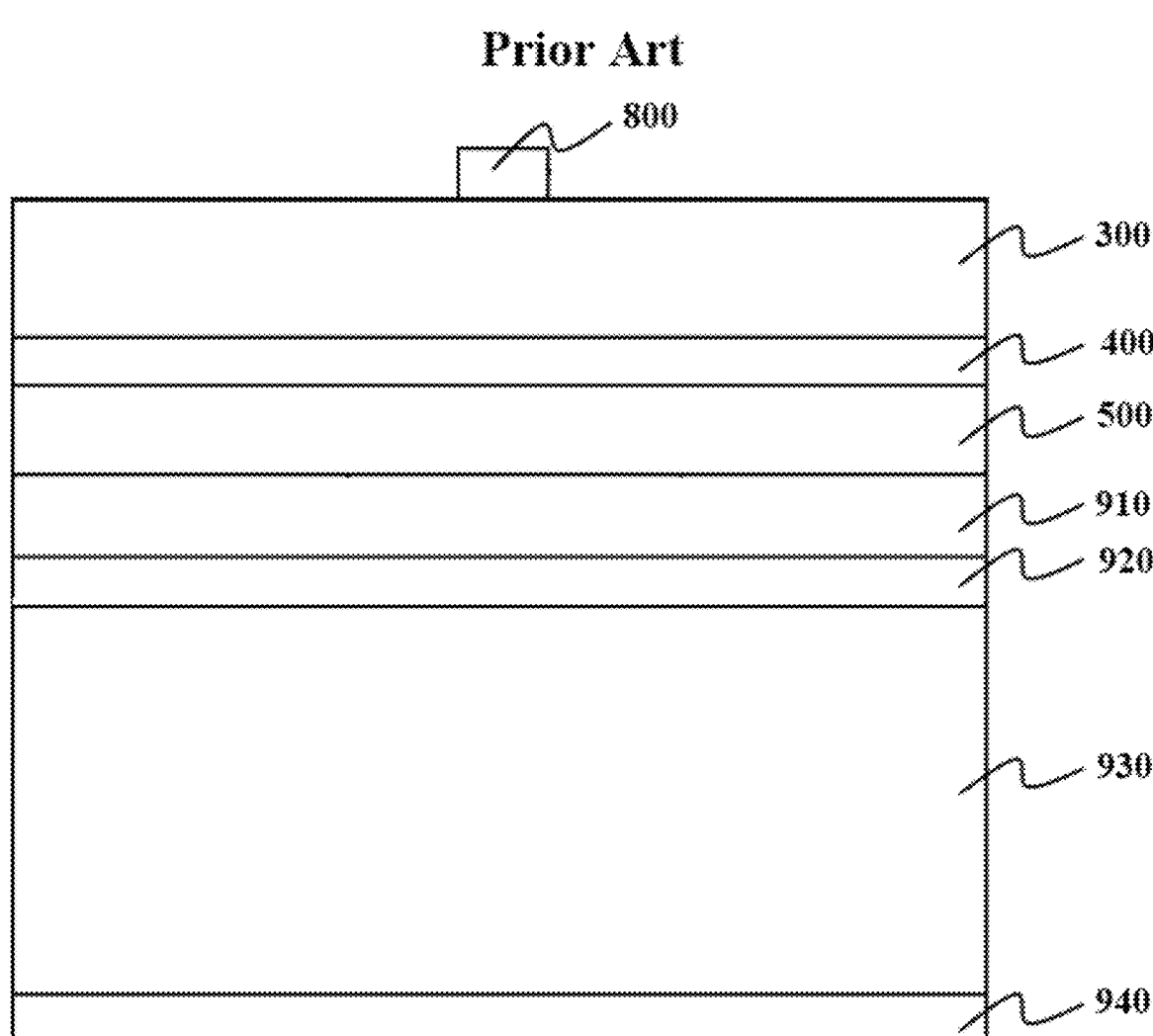
Prior Art

[FIG. 28]
Prior Art
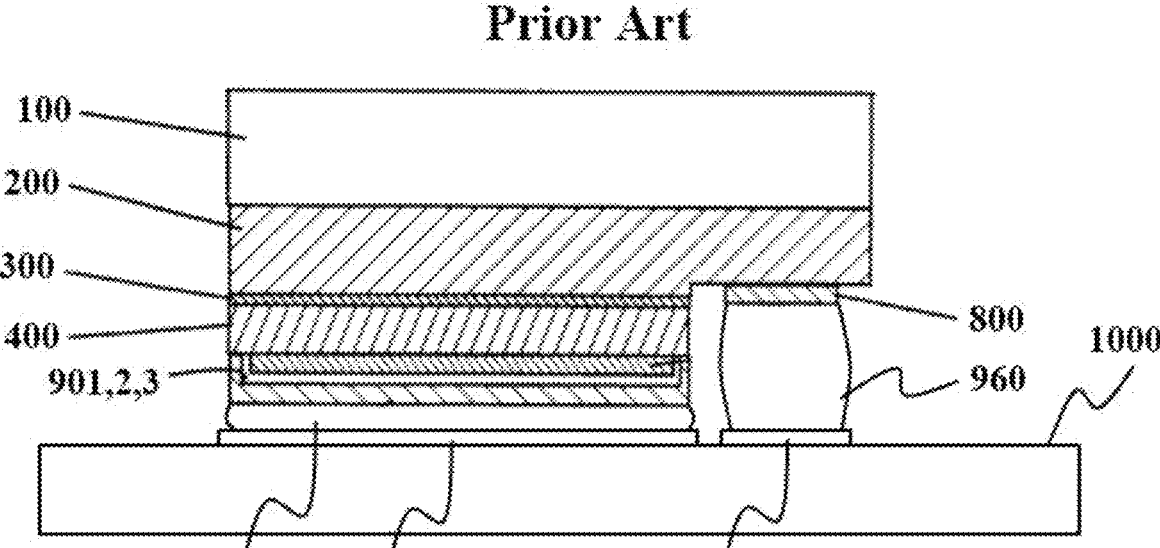
[FIG. 29]
Prior Art
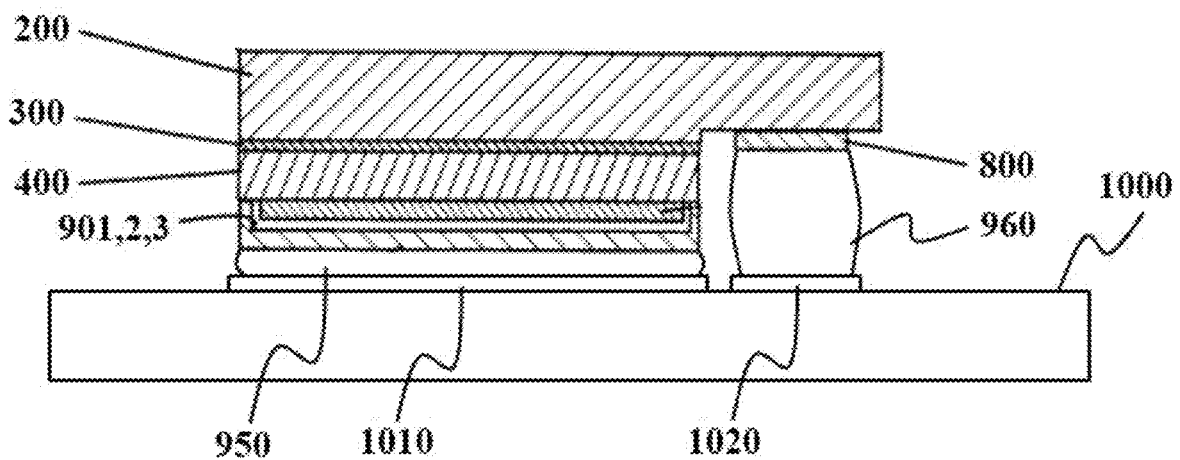

[FIG. 30]
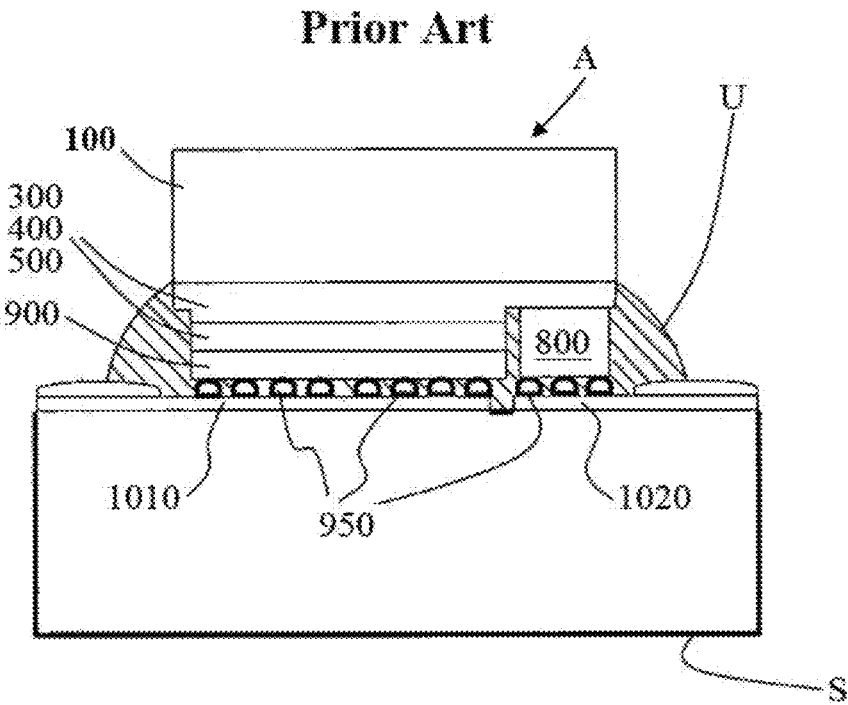
[FIG. 31]
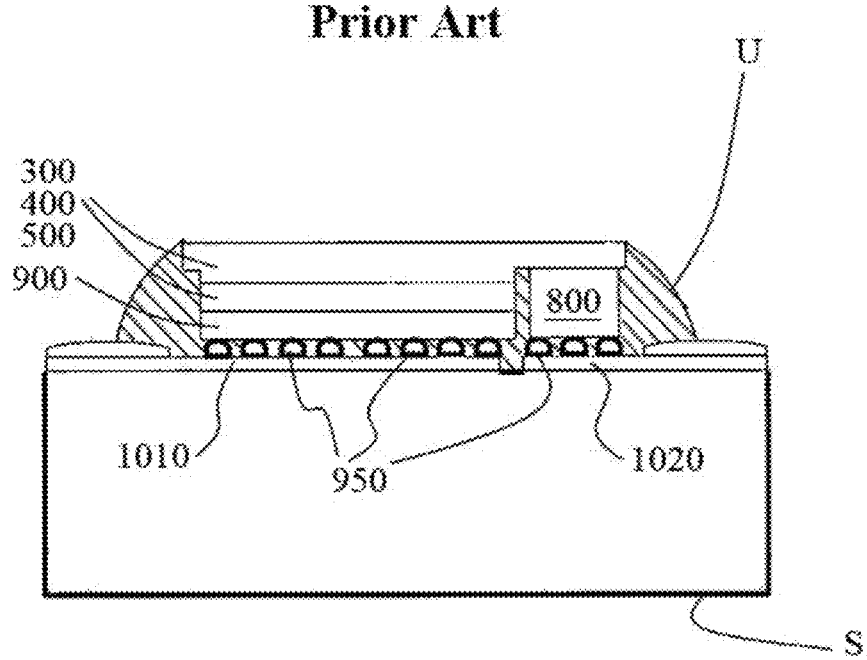

[FIG. 32]
Prior Art
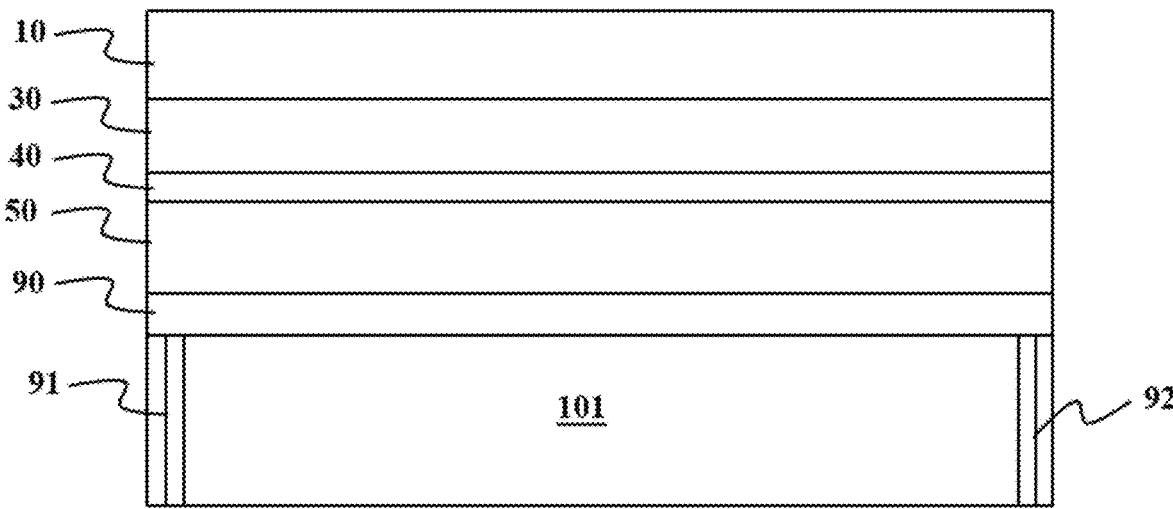
[FIG. 33]
Prior Art
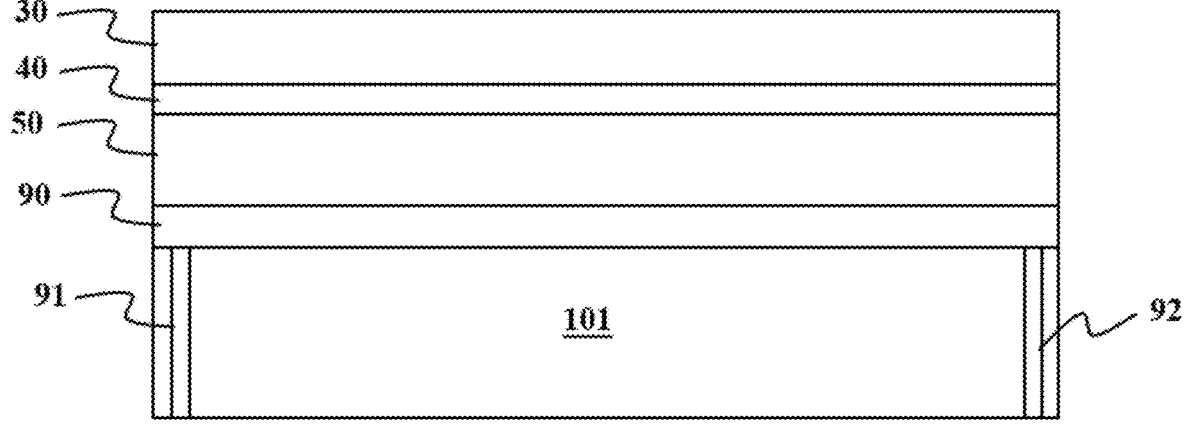

[FIG. 34]
Prior Art
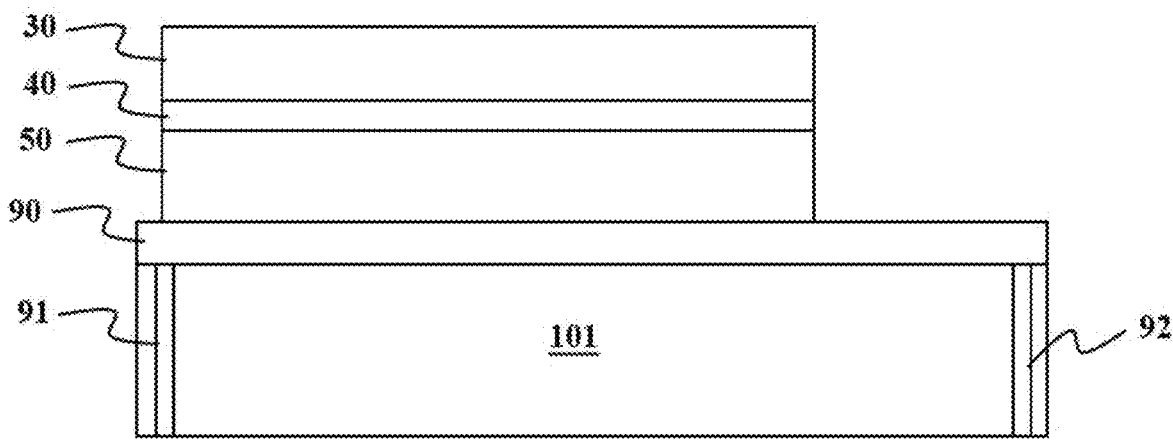
[FIG. 35]
Prior Art
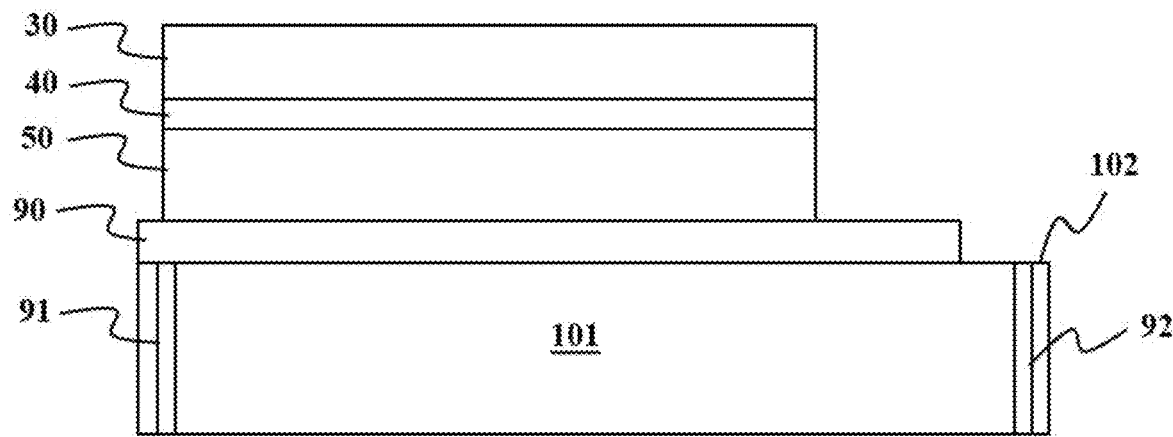

[FIG. 36]
Prior Art
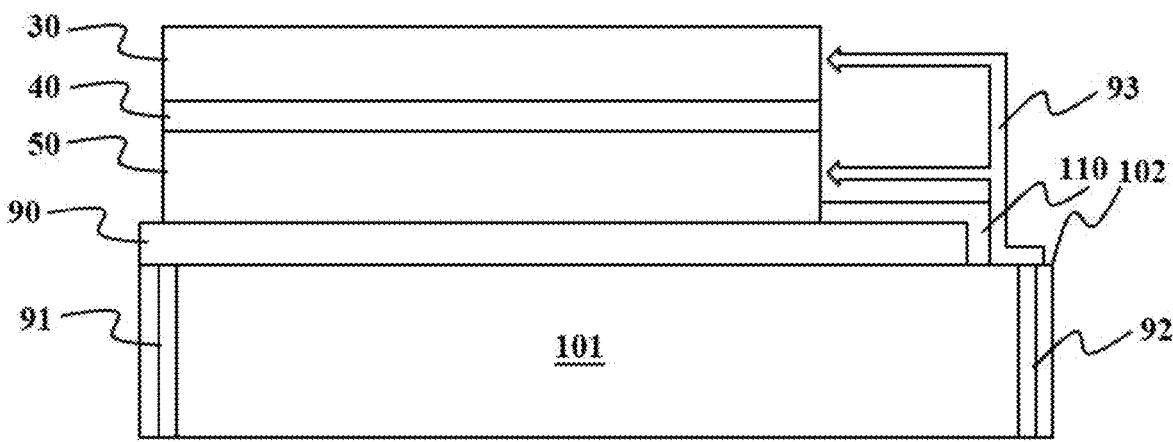
[FIG. 37]
Prior Art
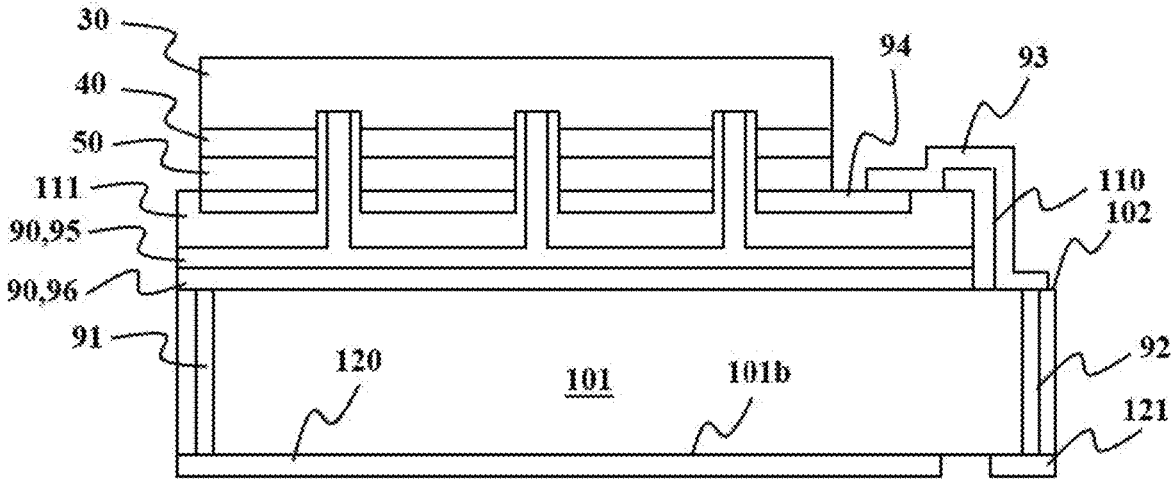

[FIG. 38]
Prior Art
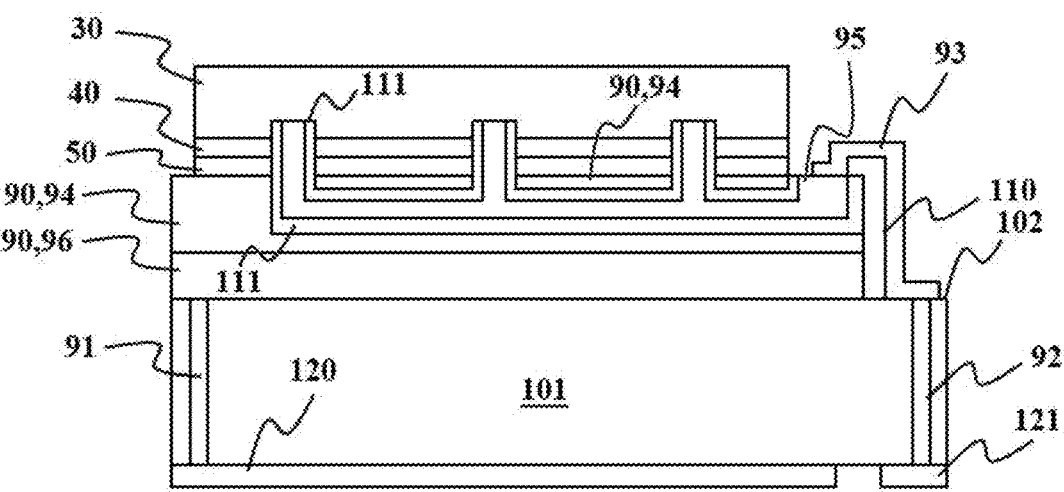
[FIG. 39]
Prior Art
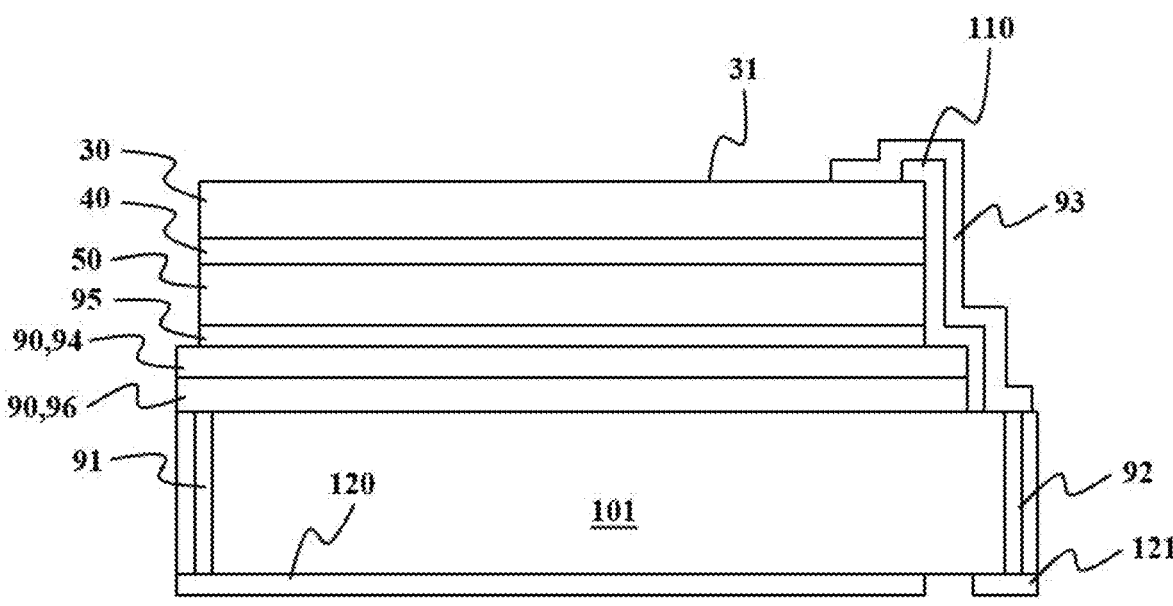

[FIG. 40]
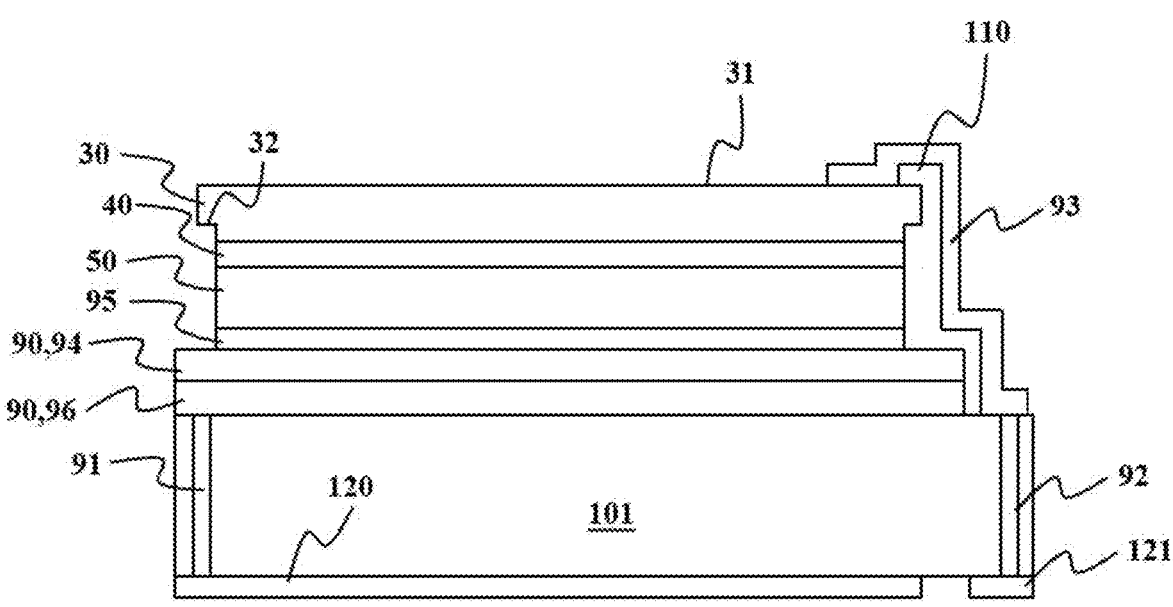
Prior Art
[FIG. 41]
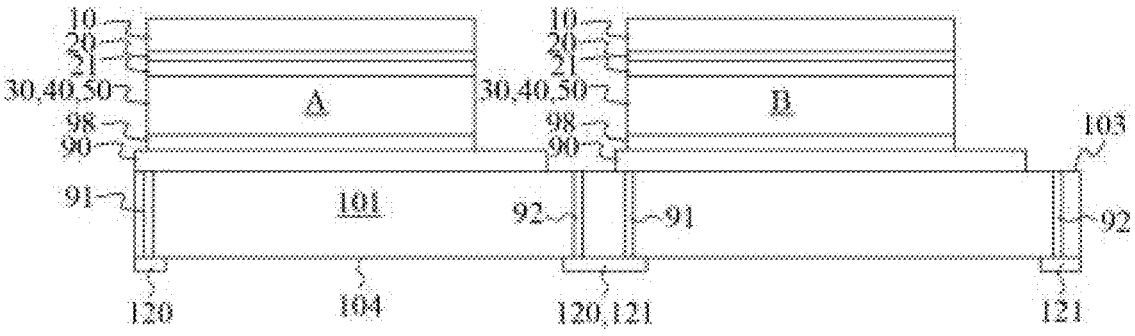

[FIG. 42]
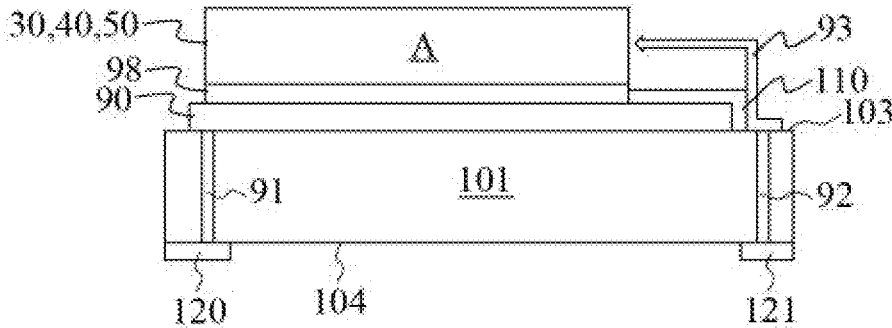

[FIG. 43]
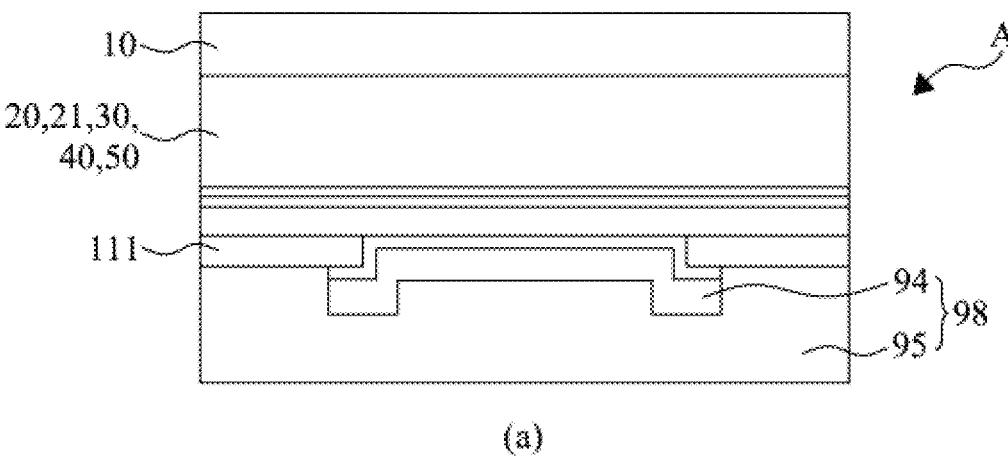
(a)
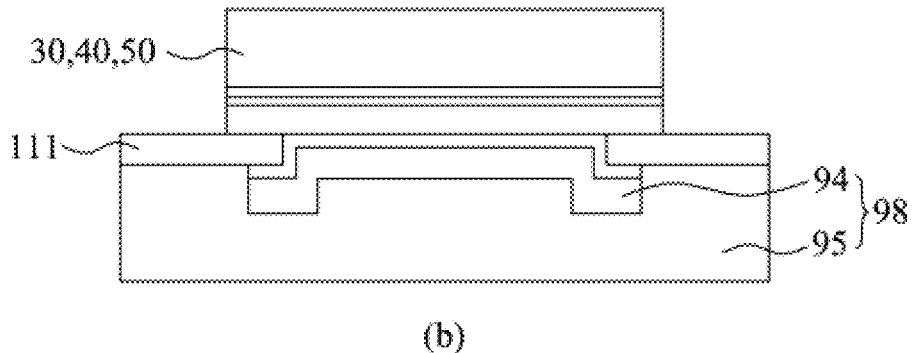
(b)
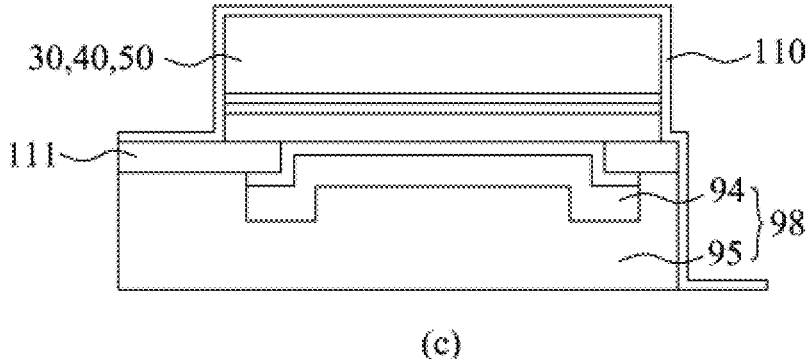
(c)

[FIG. 44]
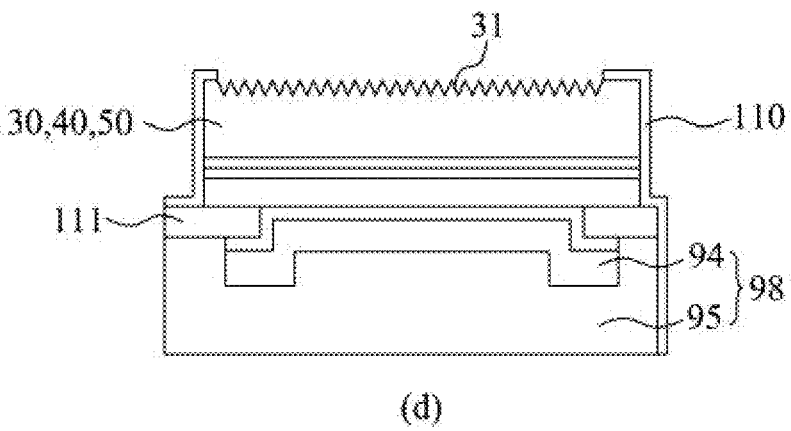
(d)
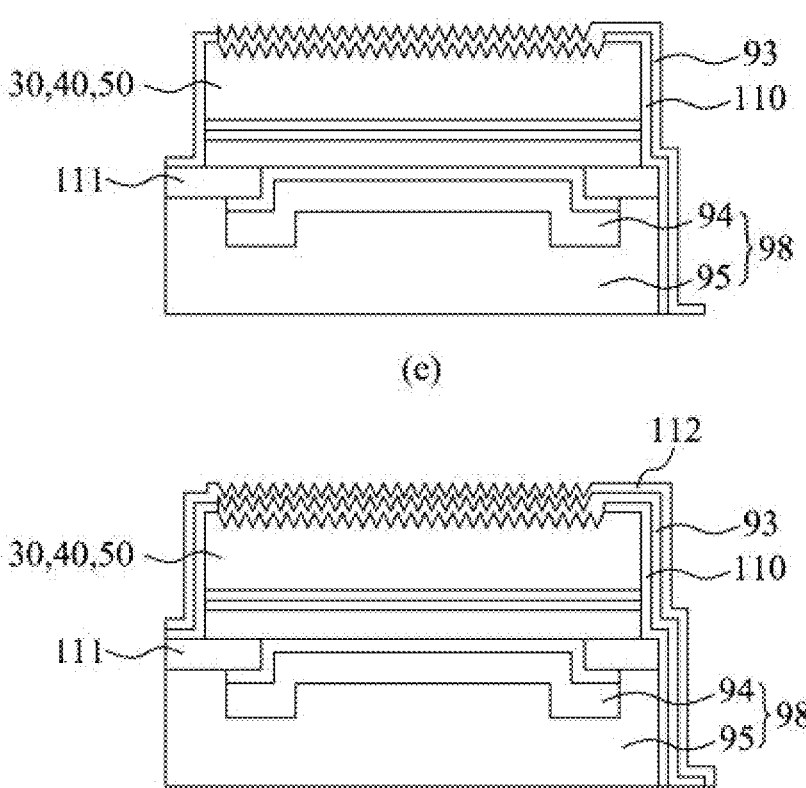
(e)
(f)

[FIG. 45]
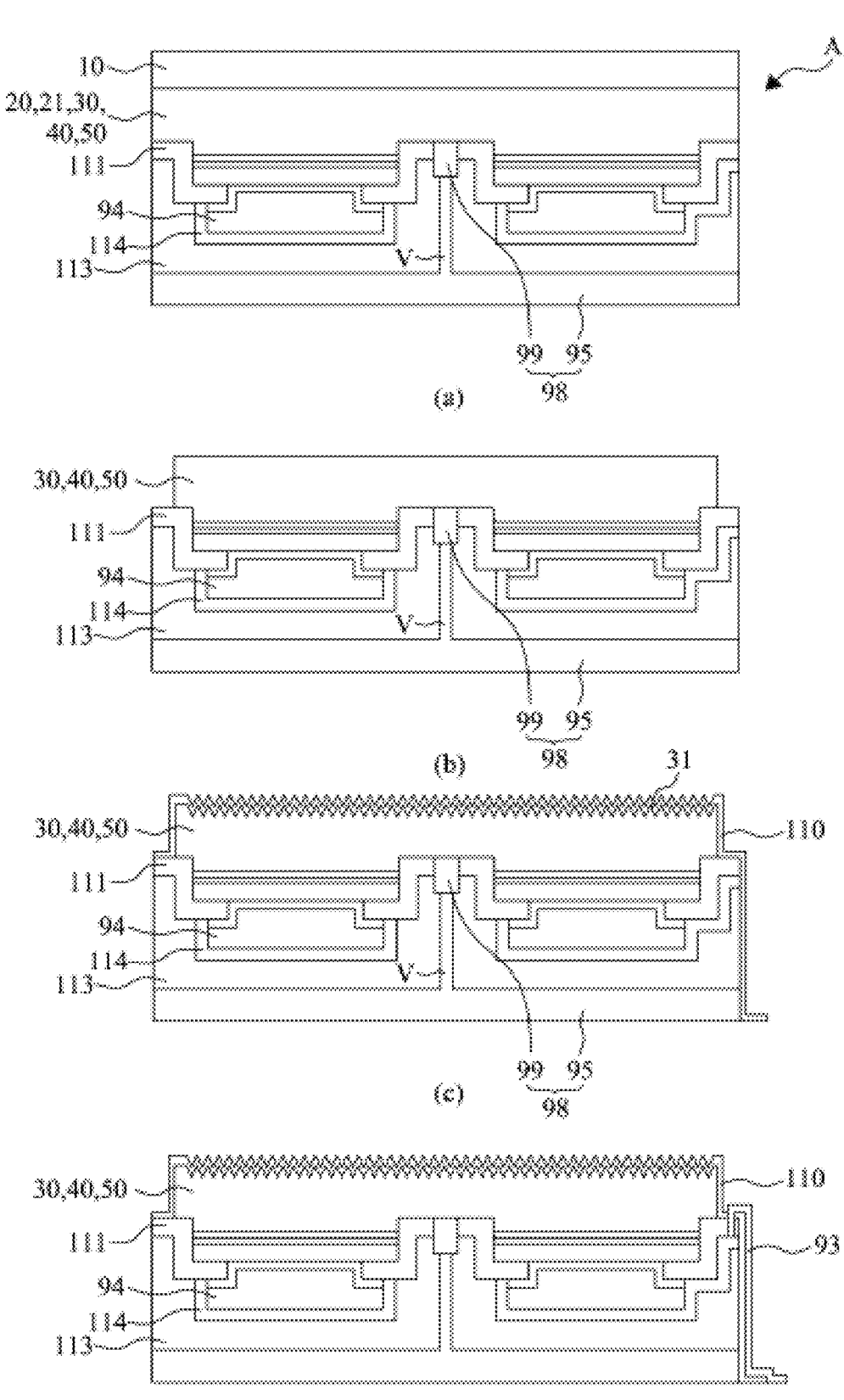

METHOD FOR MANUFACTURING SEMICONDUCTOR LIGHT EMITTING DEVICE

TECHNICAL FIELD

The present disclosure generally relates to a method of manufacturing a semiconductor light-emitting element, and more particularly, to a method of manufacturing a semiconductor light-emitting element having an electrical path in a support substrate. Here, a semiconductor light-emitting element is a semiconductor optical element which generates light through recombination of electrons and holes, for example, a group III compound (nitride, phosphide, or arsenide) semiconductor light-emitting element. A representative group III nitride semiconductor includes a compound of $Al_xGa_yIn_{1-x-y}N$ (0=x=1, 0=y=1, and 0=x+y=1).

In addition, the present disclosure generally relates to a method of manufacturing an aluminum nitride template, and more particularly, to a method of manufacturing an aluminum nitride template having no crack and a low density of crystalline defects. An aluminum nitride (AlN) template manufactured in such a manner may be used to grow a semiconductor layer including aluminum (Al) and may be representatively used in manufacturing light-emitting diodes (LEDs), laser diodes (LDs), high electron mobility transistors (HEMTs), piezoelectric thin films, and the like. In particular, the aluminum nitride (AlN) template may be used in an ultraviolet light-emitting diode (UV LED) or a semiconductor element which emits ultraviolet C (UVC) or deep ultraviolet (UV) light. UVC or deep UV light usually refers to light having a wavelength of 200 nm to 340 nm, and in some cases, refers to light having a wavelength of 200 nm to 400 nm. Here, the semiconductor light-emitting element is a semiconductor optical element that generates light through recombination of electrons and holes, for example, a group III nitride semiconductor light-emitting element. A group III nitride semiconductor is made of a compound of $Al_xGa_yIn_{1-x-y}N$ (0≤x≤1, 0≤y≤1, and 0≤x+y≤1), and the inclusion of other elements is not excluded. The semiconductor light-emitting element may have the form of a wafer or a chip.

BACKGROUND ART

This section provides background information related to the present disclosure which is not necessarily prior art.

FIG. 1 is a view illustrating an example of an ultraviolet light-emitting semiconductor element disclosed in U.S. Pat. No. 9,627,580. A semiconductor light-emitting element includes a growth substrate 10 (for example, a sapphire substrate), an AlN layer 20 (for example, a high temperature (HT) grown AlN), a first semiconductor region 30 (for example, an n-type AlGaN layer), an active region 40 (for example, a multi-quantum well structure (MQWS) of AlGaN/AlGaN) which generates light through recombination of electrons and holes, an electron blocking layer 50 (for example, p-type AlGaN), a second semiconductor region 60 (for example, p-type AlGaN), a first ohmic electrode 70 (for example, Cr/Ni), a first pad electrode 75 (for example, Au), a current spreading electrode 80 (for example, a light-transmitting electrode (indium tin oxide (ITO) or a reflective electrode (Al/Ni)), and a second pad electrode 85 (for example, Cr/Ni/Au or Au). When a light-transmitting material is used for the current spreading electrode 80 and the first pad electrode 75 and the second pad electrode 85 are used as wire bonding pads, the semiconductor light-emitting element of a type shown in FIG. 1 is referred to as a lateral chip. When a reflective metal is used for the current spreading electrode 80 and the first pad electrode 75 and the second pad electrode 85 are used as flip bonding pads, the semiconductor light-emitting element is referred to as a flip chip. Meanwhile, when the growth substrate 10 is removed and the first pad electrode 75 is formed in the first semiconductor region 60 from which the growth substrate 10 is removed, the semiconductor light-emitting element is referred to as a vertical chip (for example, U.S. Pat. No. 10,263,140).

In manufacturing a semiconductor element which emits ultraviolet light, as a wavelength of ultraviolet light is shortened, an aluminum (Al) content of the semiconductor regions 30, 40, 50, and 60 is increased, and accordingly, in the viewpoint of a thermal expansion coefficient and a lattice constant, it is ideal to use an aluminum nitride (AlN) substrate as the growth substrate 10. However, the reality is that the aluminum nitride (AlN) substrate is too expensive and does not have light transmittance required for a light-emitting element, and thus the thick AlN layer 20 having a thickness of 2 micrometers or more is formed on the sapphire growth substrate 10, which is an aluminum oxide ($Al_2O_3$) single crystal having excellent light transmittance in an ultraviolet wavelength band, and is used as an aluminum nitride template (AlN Template). In order to manufacture such an aluminum nitride template, when tensile stress caused by differences in lattice constant and thermal expansion coefficient between the growth substrate 10 made of sapphire and the HT-AlN layer 20 is not appropriately relaxed, fine microcracks are generated inside the thick AlN layer 20 having a thickness of 2 micrometers or more. In general, a film of the HT-AlN layer 20 in a two-dimension (2D) growth mode in a horizontal direction of the growth substrate is formed at a high temperature of 1,100° C. or higher on the sapphire growth substrate 10, and in such a process, in addition to commonly observed crystalline defects such as vacancies, dislocations, stacking faults, nanopipes, and inversion domains, cracks are generated. In order to solve such a problem, a plurality of air voids of a mechanism for relaxing tensile stress are introduced into the HT-AlN layer 20 or an interface between the HT-AlN layer 20 and the sapphire growth substrate 10 by appropriately applying a process of forming the HT-AlN layer 20 in a three-dimensional (3D) growth mode in a vertical direction of the growth substrate 10, thereby solving a microcrack issue. However, the HT-AlN layer 20 in such a film forming process has crystallinity having both aluminum (Al) polarity and nitrogen (N) polarity, and in particular, the HT-AlN layer 20 has a rough surface, which adversely affects not only crystal quality of a film of an active layer of the light-emitting element which is subsequently formed but also quality such as reliability and a life time of the light-emitting element.

The paper (High quality AlN epilayers grown on nitrided sapphire by metal organic chemical vapor deposition, www.nature.com/scientificreports, published on 21 Feb. 2017) discloses technology in which, before an HT-AlN layer 20 is grown on a sapphire growth substrate 10, the growth substrate 10 is nitrided to suppress an AlN material having nitrogen polarity of the HT-AlN layer 20 and overcome differences in lattice constant and thermal expansion coefficient between the sapphire growth substrate 10 and the HT-AlN layer 20, thereby forming a crack-free HT-AlN template. Nitridation may be performed by allowing $NH_3$ to flow at a low rate of 2,400 sccm and a temperature of 950° C. for 7 seconds using a metal organic chemical vapor deposition (MOCVD) method. The HT-AlN layer 20 may be grown at a temperature of 850° C. or more (for example, 1,200° C.).

An AlN template with a thickness of 2 μm to 3 μm may be obtained without cracks by applying such a method, but currently, a threading dislocation density (TDD) of the HT-AlN layer 20 reaches a range of $10^9$ cm$^{-2}$ to $10^{10}$ cm$^{-2}$, an AlN material region, which has nitrogen polarity and an irregular distribution and a dimension (size and shape), is still mixed in a matrix of the HT-AlN layer 20, and an inversion domain boundary (IDB) is formed in an AlN interface between two polarities, which seriously affects not only the crystal quality of the film of the active layer of the light-emitting element which is subsequently formed but also the quality such as the reliability and lifetime of the light-emitting element as described above. Therefore, there is a need for technology for maximally suppressing AN having nitrogen polarity in the HT-AlN layer 20.

FIG. 21 is a view illustrating an example of a semiconductor light-emitting element disclosed in U.S. Pat. No. 6,329,667. The semiconductor light-emitting element includes a first semiconductor region 5, active regions 61 and 62 (MQWS) which generate light through recombination of electrons and holes, an electron blocking layer 7, and a second semiconductor region 8. As shown in FIG. 1, the semiconductor light-emitting element may include a growth substrate, a first electrode, a second electrode, and the like. A V-shaped pit generation layer 5a is provided between the first semiconductor region 5 and the active regions 61 and 62, and the V-shaped pit generation layer 5a is formed from threading dislocation 15 leading from the first semiconductor region 5 to form V-shaped pits 49 in the active regions 61 and 62. The V-shaped pit generation layer 5a prevents the threading dislocation 15 from leading to an upper side of the semiconductor light-emitting element, thereby preventing carrier trapping. In addition, holes 17 injected from the second semiconductor region 8 may recombine with electrons 16 in a well layer 61 positioned near the first semiconductor region 5 through the V-shaped pits 49, thereby obtaining an advantage of implementing a high-efficiency semiconductor light-emitting element. The electron blocking layer 7 also serves to fill the V-shaped pits 49. The V-shaped pit generation layer 5a may be formed by growing a semiconductor layer at a low temperature (for example, 600° C. to 850° C.).

FIG. 22 is a view illustrating an example of a semiconductor light-emitting element disclosed in U.S. Pat. No. 9,184,344. An example in which a V-shaped pit generation layer is applied to an ultraviolet light-emitting semiconductor element is shown. The semiconductor light-emitting element includes a growth substrate 10, an n-type or unintentionally doped (UID) GaN layer 21' as a buffer layer, a V-shaped pit generation layer 1000, and an n⁺AlGaN layer 22' and an n⁻AlGaN layer 23' as a first semiconductor region, a p⁻AlGaN layer 42' as an electron blocking layer, a player 43' as a second semiconductor region, a first electrode 81, and a second electrode 82. The n⁻AlGaN layer 23' may be a layer having a relatively lower doping concentration than the n⁺AlGaN layer 22', and the V-shaped pit generation layer 1000 may be provided between the n⁻AlGaN layer 23' and an active region 30'. The V-shaped pit generation layer 1000 may be made of AlN, may be undoped or doped with silicon (Si), may have a doping concentration in a range of $1×10^{17}$/cm$^3$ to $5×10^{18}$/cm$^3$, may have a V-shaped pit density in a range of $2×10^8$/cm$^2$ to $2×10^9$/cm$^2$, and may have an upper width in a range of 50 nm to 500 nm. In addition, the V-shaped pit generation layer 1000 may have a thickness of 50 nm to 1,000 nm, and of course, may be formed as a single layer or a multilayer film.

The V-shaped pit generation layer 5a or 1000 is used to form a V-shaped pit in the semiconductor light-emitting element shown in FIGS. 21 and 22, a basic principle of generating the V-shaped pit in the V-shaped pit generation layer 5a or 1000 is to lower a growth temperature of the V-shaped pit generation layer 5a or 1000 (600° C. to 850° C. in FIG. 14, and 650° C. to 950° C. in FIG. 15). However, in order to manufacture a deep ultraviolet C (UVC) or ultraviolet B (UVB) light-emitting diode (LED) chip which has a peak wavelength of 320 nm or less and is made of Al-rich AlGaN (AlGaN having an Al composition of 30% or more) and AlN, crystallinity of AlN at a lower end portion adjacent to a growth substrate should be considerably improved, but AlN should be grown at a high temperature of 1,000° C. or more. However, as in a semiconductor light-emitting element shown in FIG. 15, by using AlN doped with silicon (Si) at a doping concentration of $1×10^{17}$/cm$^3$ to $5×10^{18}$/cm$^3$ and grown at a growth temperature of 650° C. to 950° C., it is not possible to obtain a required density of V-shaped pits, and it is impossible to obtain high-quality Al-rich AlGaN and AlN thin films required for a high-performance deep ultraviolet light-emitting semiconductor element.

Therefore, in order to obtain a high-quality thin film required for an ultraviolet light-emitting semiconductor element, there is a need to form the V-shaped pit generation layer at a temperature of 1,000° C. or more and to dope silicon (Si) at a doping concentration of $6×10^{18}$/cm$^3$ or more to form the V-shaped pit under such a growth temperature.

FIG. 25 is a view illustrating an example of a semiconductor light-emitting chip in the form of a lateral chip. The semiconductor light-emitting chip includes a substrate 100 (for example, a sapphire substrate), a buffer region 200 (for example, undoped GaN), a first semiconductor region 300 (for example, Si-doped GaN) having first conductivity, an active region 400 (for example, an MQWS of InGaN/(In) GaN) which generates light through recombination of electrons and holes, a second semiconductor region 500 (for example, Mg-doped GaN) having second conductivity different from the first conductivity, a light-transmitting conductive film 600 (for example, ITO) for current spreading, an electrode 700 (for example, Cr/Ni/Au) serving as a bonding pad, and an electrode 800 (for example, Cr/Ni/Au) serving as a bonding pad on the first semiconductor region 300 which is etched and exposed. The electrode 700 and the electrode 800 receive electricity from an external power source through wire bonding.

FIG. 26 is a view illustrating an example of a semiconductor light-emitting chip in the form of a flip chip. The semiconductor light-emitting chip includes a substrate 100, a first semiconductor region 300 having first conductivity, an active region 400 which generates light through recombination of electrons and holes, a second semiconductor region 500 having second conductivity different from the first conductivity, an electrode film 901 (for example, Au), an electrode film 902 (for example, Ni), and an electrode film 903 (for example, Au) which are formed as three layers for reflecting light toward the substrate 100, and an electrode 800 serving as a bonding pad on the first semiconductor region 300 which is etched and exposed. The electrode films 901, 902, and 903 formed as three layers and the electrode 800 are connected to an external power board (for example, a printed circuit board (PCB)) through a conductive paste or metal bonding without wire bonding, and a reflecting function of the electrode films 901, 902, and 903 formed as three layers may be substituted with a dielectric material such as a distributed Bragg reflector (DBR) (for example, U.S. Pat. No. 9,236,524).

FIG. 27 is a view illustrating an example of a semiconductor light-emitting chip in the form of a vertical chip. The semiconductor light-emitting chip includes a first semiconductor region 300 having first conductivity, an active region 400 which generates light through recombination of electrons and holes, a second semiconductor region 500 having second conductivity different from the first conductivity, a metal reflective film 910 for reflecting light to the first semiconductor region 300, a bonding layer 920, a support substrate 930, an electrode 940 serving as a bonding pad, and an electrode 800 serving as a bonding pad on the first semiconductor region 300. The electrode 940 is connected to an external power source without wire bonding like the electrode films 901, 902, and 903 formed as three layers shown in FIG. 26, and the electrode 800 is connected to the external power source through wire bonding like the electrode 800 shown in FIG. 25. Of course, the electrode 800 may also be connected to the external power source through metal deposition without using wire bonding (for example, U.S. Pat. No. 10,263,140).

A lateral chip and a vertical chip are classified according to a current flowing method, and wire bonding and flip bonding are classified according to a method of bonding with an external power source. The lateral chip is a wire bonding chip using two wires, and the vertical chip is a wire bonding chip using one wire. When the flip chip is classified according to a current flowing method, the flip chip may be regarded as a type of the lateral chip. In the present disclosure, a chip that uses wire bonding is defined as a wire bonding chip irrespective of a lateral chip or a vertical chip, and a flip chip and a vertical chip that do not use a wire are defined as a non-wire bonding chip. When a package, an interposer, a display, or the like is implemented using a wire bonding chip, since a space for bonding wires is required, it is not easy to implement a semiconductor light-emitting element having a small form factor. Therefore, it is necessary to use a non-wire bonding chip to implement a semiconductor light-emitting element having a small form factor.

FIGS. 28 and 29 are views illustrating an example of a method of manufacturing a semiconductor light-emitting element including a non-wire bonding chip. First, as shown in FIG. 28, a semiconductor light-emitting chip as shown in FIG. 26 is mounted on a line substrate 1000. Specifically, electrode films 901, 902, and 903 formed as three layers and an electrode pattern 1010 are aligned, an electrode 800 and an electrode pattern 1020 are aligned, and then stud bumps, pastes, or eutectic metals 950 and 960 are used to bond the semiconductor light-emitting chip to the line substrate 100. Then, as shown in FIG. 29, a substrate 100 is removed using a laser, thereby completing a semiconductor light-emitting element including a non-wire bonding chip.

FIGS. 30 and 31 are views illustrating an example of a method of manufacturing a semiconductor light-emitting element disclosed in U.S. Patent Publication No. 2006-0202223. First, as shown in FIG. 30, in order to prevent a semiconductor light-emitting chip A from being broken in a process of manufacturing a semiconductor light-emitting element shown in FIG. 29 (in a laser lift-off (LLO) process and subsequent processes), in a state in which the semiconductor light-emitting chip A is attached to a support substrate S, before an LLO process is performed, an underfill material U is introduced into the semiconductor light-emitting chip A and the support substrate S. Filling a space between the semiconductor light-emitting chip A and the support substrate S by injecting the underfill material U is an essential element when the LLO process is used. Next, as shown in FIG. 31, a substrate 100 is removed, thereby completing a semiconductor light-emitting element. Electrodes 901, 902, and 903 formed as three layers shown in FIGS. 26 and 29 are represented by an electrode structure 900, and as described above, the electrode structure 900 may have a metal reflective film structure, a dielectric reflective film structure, or a combination thereof.

FIGS. 32 to 40 are views illustrating a method of manufacturing a semiconductor light-emitting element disclosed in U.S. Pat. No. 10,263,140. In order to solve problems of the method of manufacturing a semiconductor light-emitting element shown in FIGS. 31 and 32 (problems in which since a process is performed at a chip level, the process is long and complicated, and there is a difficulty in aligning an electrode structure 900, an electrode 800, and electrode patterns 1010 and 1020), there is provided a method of manufacturing a semiconductor light-emitting element after performing a substrate removal process at a wafer level and dividing the substrate into a plurality of semiconductor light-emitting chips.

An example of the method of manufacturing a semiconductor light-emitting element disclosed in U.S. Pat. No. 10,263,140 is shown in FIGS. 32 to 36.

First, as shown in FIG. 32, a semiconductor light-emitting element is provided to include a substrate 10 (for example, sapphire, Si, AlN, AlGaN, or SiC), a plurality of semiconductor regions including a first semiconductor region 30 (for example, n-type GaN) having first conductivity, a second semiconductor region 50 (p-type GaN) having second conductivity different from the first conductivity, and an active region 40 (for example, an MQWS of InGaN/(In)GaN) interposed between the first semiconductor region 30 and the second semiconductor region 50 and configured to generate light through recombination of electrons and holes, a bonding layer 90, and a support substrate 101 having a first electrical path 91 and a second electrical path 92. The plurality of semiconductor regions 30, 40, and 50 and the support substrate 101 (for example, SiC, AlSiC, AlN, AlGaN, GaN, sapphire, low temperature co-fired ceramic (LTCC), or high temperature co-fired ceramic (HTCC)) are coupled or bonded through the bonding layer 90. Conductivity of the first semiconductor region 30 and conductivity of the second semiconductor region 50 may be changed, and when the active region 40 emits ultraviolet light, the first semiconductor region 30 and the second semiconductor region 50 may be made of AlGaN, and the active region 40 may be have an MQWS of AlGaN/AlGaN. As a peak wavelength approaches to that of UVB and UVC, an Al content increases. The bonding layer 90 may be formed through a typical wafer bonding method used when the semiconductor light-emitting chip shown in FIG. 27 is manufactured.

Next, as shown in FIG. 33, the substrate 10 is isolated and removed from the plurality of semiconductor regions 30, 40, and 50. The substrate 10 may be removed using a known LLO method, a wet etching method using a sacrificial layer, a grinding method, a chemical-mechanical polishing (CMP) method, or the like.

Then, as shown in FIG. 34, in a wafer level state (a wafer level should be understood as a concept relative to a chip level, and in general, the wafer level refers to a state in which the plurality of semiconductor regions 30, 40, and 50 are stacked on the substrate 10 but should be understood as including a state in which the plurality of semiconductor regions 30, 40, and 50 are disposed on the substrate 10 sawn into a bulk that is greater than the chip level before the chip level is obtained, that is, before the substrate 10 is sawn into chips having an actually used shape), in order to manufacture individual dies or chips, the plurality of semiconductor regions 30, 40, and 50 are partially removed to isolate the bonding layer 90 to be exposed.

Next, as shown in FIG. 35, the bonding layer 90 is removed to form a bonding layer removal surface 102 and expose a second electrical path 92. The bonding layer 90 may be removed using known dry etching or wet etching. A sequence of a process of isolating the plurality of semiconductor regions 30, 40, and 50 into individual dies or chips and a process of removing the bonding layer 90 does not necessarily follow such a sequence. First, the plurality of semiconductor regions 30, 40, and 50 and the bonding layer 90 are removed to form the bonding layer removal surface 102, and then the plurality of semiconductor regions 30, 40, and 50 may be isolated into the individual dies or chips.

Finally, as shown in FIG. 36, an insulating layer 110 (for example, SiO) is formed as necessary, and an electrical connection 93 is formed. The electrical connection 93 may be formed by depositing a metal widely used in a semiconductor process. The bonding layer 90 may be formed by providing a bonding material to all of the plurality of semiconductor regions 30, 40, and 50 and the support substrate 101 or may be formed by proving a bonding material to only one side thereof. The first electrical path 91 and the second electrical path 92 may be formed by forming a hole in the support substrate 101 and then inserting a conductive material, and for example, electroplating may be used. The first electrical path 91 and the second electrical path 92 may pass through the support substrate 101 from the beginning or may be in a form in which the support substrate 101 is ground and exposed. An example of the support substrate 101 is disclosed in U.S. Patent Publication No. 2017-0317230.

FIG. 37 shows an example of a method of forming an electrical connection shown in FIG. 36. A first electrical connection 91 is electrically connected to a first semiconductor region 30 through a bonding layer 90 to supply electrons to an active region 40 through a first semiconductor region 30. A second electrical connection 92 is electrically connected to a second semiconductor region 40 through an electrical connection 93 via a first conductive layer 94 to supply holes the active region 40 through a second semiconductor region 50. A first conductive layer 94 is exposed by removing a plurality of semiconductor regions 30, 40, and 50 and is electrically connected to the electrical connection 93. It is preferable that the first conductive layer 94 is made of a material having both of a function of spreading a current to the second semiconductor region 50 and a function of reflecting light generated in the active region 40 toward the first semiconductor region 30. The first conductive layer 94 may be made of Au, Pt, Ag, Al, Rh, Cr, Cu, Ta, Ni, Pd, Mg, Ru, Ir, Ti, V, Mo, W, TiW, CuW, ITO, ZnO, SnO$_2$, In$_2$O$_3$, or an alloy thereof or may be formed as two or more layers made of Au, Pt, Ag, Al, Rh, Cr, Cu, Ta, Ni, Pd, Mg, Ru, Ir, Ti, V, Mo, W, TiW, CuW, ITO, ZnO, SnO$_2$, In$_2$O$_3$, or an alloy thereof. The electrical connection 93 may be made of Au, Pt, Ag, Al, Rh, Cr, Cu, Ta, Ni, Pd, Mg, Ru, Ir, Ti, V, Mo, W, TiW, CuW, or an alloy thereof or may be formed as two or more layers made of A Au, Pt, Ag, Al, Rh, Cr, Cu, Ta, Ni, Pd, Mg, Ru, Ir, Ti, V, Mo, W, TiW, CuW, or an alloy thereof. The bonding layer 90 includes a conductive bonding layer 96 provided on a support substrate 101 and a second conductive layer 95 which is provided in the plurality of semiconductor regions 30, 40, and 50 and passes through the second semiconductor region 50 and the active region 40 to lead to the first semiconductor region 30. The second conductive layer 95 may be made of a single material, or a side thereof in contact with the conductive bonding layer 96 may be made of a separate material suitable for bonding. The second conductive layer 95 may be made of a material in ohmic contact with an GaN material and a material serving as a bonding agent. The second conductive layer 95 may be made of Pt, Ag, Al, Rh, Cu, Ta, Ni, Pd, Ti, V, Mo, W, TiW, CuW, Sn, In, Bi, or an alloy thereof or may be formed as two or more layers made of Pt, Ag, Al, Rh, Cu, Ta, Ni, Pd, Ti, V, Mo, W, TiW, CuW, Sn, In, Bi, or an alloy thereof. The conductive bonding layer 96 may be made of a material having excellent adhesion to the support substrate 101 and a material serving as a bonding agent and may be made of Ti, Ni, W, Cu, Ta, V, TiW, CuW, Au, Pd, Sn, In, Bi, or an alloy or may be formed as two or more layers made of Ti, Ni, W, Cu, Ta, V, TiW, CuW, Au, Pd, Sn, In, Bi, or an alloy thereof. Reference numerals 110 and 111 denote insulating layers, and reference numerals 120 and 121 denote conductive pads.

FIG. 38 shows another example of a method of forming an electrical connection shown in FIG. 36. A first conductive layer 94 and a conductive bonding layer 96 are bonded to form a bonding layer 90, and a second conductive layer 95 is connected to an electrical connection 93 to supply a current to a first semiconductor region 30 from a second electrical path 92.

FIG. 39 shows still another example of a method of forming an electrical connection shown in FIG. 36. A conductive bonding layer 96 and a second conductive layer 94 are bonded to form a bonding layer 90. However, the second conductive layer 94 only participates in bonding and does not supply a current to a first semiconductor region 30. A first electrical path 91 is electrically connected to a second semiconductor region 50 through the bonding layer 90 and a first conductive layer 95. In this case, the first conductive layer 95 may serve as a reflective film and/or a current spreading layer. A current may be supplied to the first semiconductor region 30 by an electrical connection 93 leading from a second electrical path 92 to a substrate removal surface 31.

FIG. 40 shows yet another example of a method of forming an electrical connection shown in FIG. 36. Prior to bonding, a second semiconductor region 50 and an active region 40 are removed from a plurality of semiconductor regions 30, 40, and 50 to form a mesa surface 32 in a first semiconductor region 30. In addition, after the mesa surface 32 is formed, an isolation process may be performed on the plurality of semiconductor regions 30, 40, and 50 in advance. According to such a configuration, after the mesa surface 32 is formed, the active region 40 may be provided as a protective layer (for example, SiO$_2$), that is, may become a portion of an insulating layer 110 so that reliability of an element can be improved in a subsequent process.

As pointed out in relation to the method shown in FIGS. 30 and 31 that it is essential to fill the space between the semiconductor light emitting chip A and the support substrate S by injecting the underfill material U in the LLO process, even in the methods shown in FIGS. 32 to 40, in the LLO process, an entire surface of the plurality of semiconductor regions 30, 40, and 50 and an entire surface of the support substrate 101 being tightly bonded to each other is a very essential element in preventing the plurality of semiconductor regions 30, 40, and 50 from being broken in the LLO process.

In addition, according to the methods shown in FIGS. 32 to 40, since an alignment between the first and second electrical paths 91 and 92 and the plurality of semiconductor regions 30, 40, and 50 is performed at a wafer level, the alignment can be performed without difficulty.

However, after the substrate 10 is removed, it is necessary to electrically connect the second electrical path 92 and the plurality of semiconductor regions 30, 40, and 50. To this end, the bonding layer 90 should be removed in advance to form the bonding layer removal surface 102, and the second electrical path 92 and the second semiconductor region 50 should be connected using the electrical connection 93. However, it is not easy to remove the sticky bonding layer 90, which, when a semiconductor light-emitting element (for example, an UVB or UVC chip scale package (CSP)) having a small form factor is manufactured, since the second electrical path 92 should exposed with precision is added, causes further difficulties.

DISCLOSURE

Technical Problem

This will be described at the end of "Modes of the Invention."

Technical Solution

This section provides a general summary of the disclosure and is not a comprehensive disclosure of its full scope or all of its features According to one aspect of the present disclosure, there is provided an ultraviolet light-emitting semiconductor element including a plurality of semiconductor regions which include a first semiconductor region which is grown using a growth substrate and has first conductivity, a second semiconductor region having second conductivity different from the first conductivity, and an active region interposed between the first semiconductor region and the second semiconductor region and configured to emit ultraviolet light through recombination of electrons and holes, a high temperature grown $Al_xGa_{1-x}N$ (0.5≤x≤1) layer provided below the first semiconductor region, and an inversion domain (ID) and inversion domain boundary (IDB) suppression layer provided between the growth substrate and the high temperature grown $Al_xGa_{1-x}N$ (0.5≤x≤1) layer.

According to another aspect of the present disclosure, there is provided an ultraviolet light-emitting semiconductor element including a plurality of semiconductor regions which include a first semiconductor region which is grown using a growth substrate and has first conductivity, a second semiconductor region having second conductivity different from the first conductivity, and an active region interposed between the first semiconductor region and the second semiconductor region and configured to emit ultraviolet light through recombination of electrons and holes, an $Al_xGa_{1-x}N$ (0.5≤x≤1) layer which is provided in the first semiconductor region at a side opposite to the active region and is intentionally undoped, a support substrate provided at a side of the second semiconductor region and configured to support the plurality of semiconductor regions from which the growth substrate is removed, and a bonding layer configured to bond the plurality of semiconductor regions and the support substrate.

According to another aspect of the present disclosure, there is provided an ultraviolet light-emitting semiconductor element including a plurality of semiconductor regions which include a first semiconductor region which is grown using a growth substrate and has first conductivity, a second semiconductor region having second conductivity different from the first conductivity, and an active region interposed between the first semiconductor region and the second semiconductor region and configured to emit ultraviolet light through recombination of electrons and holes, a first AlN layer grown on the growth substrate, a stress adjustment layer, a second AlN layer provided below the first semiconductor region, a first AlGaN region which is provided as multiple layers between the first AlN layer and the stress adjustment layer, has an aluminum (Al) composition difference of less than 20% from the first AlN layer at a side thereof in contact with the first AlN layer, and has an aluminum (Al) composition difference of less than 20% from the stress adjustment layer at a side thereof in contact with the stress adjustment layer and in which each of the multiple layers has an aluminum (Al) composition difference of less than 20%, and a second AlGaN region which is provided as multiple layers between the stress adjustment layer and the second AlN layer, has an aluminum (Al) composition difference of less than 20% from the stress adjustment layer at a side thereof in contact with the stress adjustment, and has an aluminum (Al) composition difference of less than 20% from the second AlN layer at a side thereof in contact with the second AlN layer and in which each of the multiple layers has an aluminum (Al) composition difference of less than 20%.

According to another aspect of the present disclosure, there is provided an ultraviolet light-emitting semiconductor element including a plurality of semiconductor regions which include a first semiconductor region which is grown using a growth substrate and has first conductivity, a second semiconductor region having second conductivity different from the first conductivity, and an active region interposed between the first semiconductor region and the second semiconductor region and configured to emit ultraviolet light through recombination of electrons and holes, a first AlN layer grown on the growth substrate, a stress adjustment layer, an $Al_xGa_{1-x}N$ (0.5≤x≤1) layer provided below the first semiconductor region, a first AlGaN region which is provided as multiple layers between the first AlN layer and the stress adjustment layer, has an aluminum (Al) composition difference of less than 20% from the first AlN layer at a side thereof in contact with the first AlN layer, has an aluminum (Al) composition difference of less than 20% from the stress adjustment layer at a side thereof in contact with the stress adjustment layer and in which each of the multiple layers has an aluminum (Al) composition difference of less than 20%, and a second AlGaN region which is provided as multiple layers between the stress adjustment layer and the $Al_xGa_{1-x}N$ (0.5≤x≤1) layer, has an aluminum (Al) composition difference of less than 20% from the stress adjustment layer at a side thereof in contact with the stress adjustment layer, and has an aluminum (Al) composition difference of less than 20% from the $Al_xGa_{1-x}N$ (0.5≤x≤1) layer at a side thereof in contact with the $Al_xGa_{1-x}N$ (0.5≤x≤1) layer and in which each of the multiple layers has an aluminum (Al) composition difference of less than 20%.

According to another aspect of the present disclosure, there is provided a method of manufacturing an aluminum nitride template, the method including providing a growth substrate, growing an $Al_{1-v-w}Ga_vIn_wN$ (0≤v<1, 0≤w<1, and v+w<1) layer on the growth substrate, performing etching to decompose and evaporate gallium (Ga) and indium (In) in the $Al_{1-v-w}Ga_vIn_wN$ (0≤v<1, 0≤w<1, and v+w<1) layer such that the $Al_{1-v-w}Ga_vIn_wN$ (0≤v<1, 0≤w<1, and v+w<1) layer becomes a porous $Al_{1-v-w}Ga_vIn_wN$ ($0 \le v < 1$, $0 \le w < 1$, and $v+w < 1$) layer having a plurality of voids, and growing an AlN layer on the porous $Al_{1-v-w}Ga_vIn_wN$ ($0 \le v < 1$, $0 \le w < 1$, and $v+w < 1$) layer.

According to another aspect of the present disclosure, there is provided a method of manufacturing an ultraviolet light-emitting semiconductor element including a plurality of semiconductor regions which include a first semiconductor region which is grown using a growth substrate and has first conductivity, a second semiconductor region having second conductivity different from the first conductivity, and an active region interposed between the first semiconductor region and the second semiconductor region and configured to emit ultraviolet light having a peak wavelength of 320 nm or less through recombination of electrons and holes, the method including growing the first semiconductor region, growing a V-shaped pit generation layer having a V-shaped pit on the first semiconductor region at a growth temperature of 1,000° C. or more and a doping concentration in a range of $6 \times 10^{18}/cm^3$ to $5 \times 10^{19}/cm^3$, growing the active region while maintaining the V-shaped pit, and growing the second semiconductor region on the active region.

According to another aspect of the present disclosure, there is provided a method of manufacturing a semiconductor light-emitting element through non-wire bonding, the method including providing a semiconductor light-emitting die which is individualized from a wafer state and includes a substrate, a plurality of semiconductor regions (including a first semiconductor region having first conductivity, an active region configured to generate light through recombination of electrons and holes, and a second semiconductor region having second conductivity different from the first conductivity), and a conductive bonding structure electrically connected to one of the first semiconductor region and the second semiconductor region and formed on the entirety of the second semiconductor region, and providing a support substrate which has an upper surface and a lower surface and includes a first electrical path and a second electrical path leading from the upper surface to the lower surface and a bonding layer configured to cover the first electrical path on the upper surface and electrically connected thereto, attaching the semiconductor light-emitting die to the support substrate in a state in which the second electrical path is exposed such that the conductive bonding structure covering the entirety of the second semiconductor region is tightly bonded to the bonding layer, removing the substrate, and electrically connecting the second electrical path to the other one of the first semiconductor region and the second semiconductor region through deposition using an electrical connection.

Advantageous Effects

This will be described at the end of "Modes of the Invention."

DESCRIPTION OF DRAWINGS

FIG. 1 is a view illustrating an example of an ultraviolet light-emitting semiconductor element disclosed in U.S. Pat. No. 9,627,580.

FIG. 2 is a view illustrating an example of an ultraviolet light-emitting semiconductor element according to the present disclosure.

FIG. 3 is a view illustrating another example of an ultraviolet light-emitting semiconductor element according to the present disclosure.

FIG. 4 is a view illustrating still another example of an ultraviolet light-emitting semiconductor element according to the present disclosure.

FIG. 5 is a view illustrating yet another example of an ultraviolet light-emitting semiconductor element according to the present disclosure.

FIG. 6 is a view illustrating yet another example of an ultraviolet light-emitting semiconductor element according to the present disclosure.

FIG. 7 is a view illustrating yet another example of an ultraviolet light-emitting semiconductor element according to the present disclosure.

FIG. 8 is a view illustrating an example of a semiconductor light-emitting element disclosed in U.S. Pat. No. 10,263,140.

FIG. 9 is a view illustrating an example of a semiconductor light-emitting element in the form of a semiconductor chip according to the present disclosure.

FIG. 10 is a view illustrating a specific example of the semiconductor light-emitting element shown in FIG. 9.

FIG. 11 is a view illustrating another specific example of the semiconductor light-emitting element shown in FIG. 9.

FIG. 12 is a view illustrating still another specific example of the semiconductor light-emitting element shown in FIG. 9.

FIG. 13 is a view illustrating yet another specific example of the semiconductor light-emitting element shown in FIG. 9.

FIG. 14 is a view illustrating yet another example of an ultraviolet light-emitting semiconductor element according to the present disclosure.

FIG. 15 is a view for describing a fluctuation in curvature during growth of the ultraviolet light-emitting semiconductor element shown in FIG. 14.

FIGS. 16 and 17 are views illustrating an example of a method of manufacturing an aluminum nitride (AlN) template according to the present disclosure.

FIG. 18 shows views illustrating an example of the method of manufacturing an aluminum nitride (AlN) template shown in FIG. 17.

FIG. 19 shows views illustrating another example of the method of manufacturing an aluminum nitride (AlN) template shown in FIG. 17.

FIG. 20 shows views illustrating still another example of the method of manufacturing an aluminum nitride (AlN) template shown in FIG. 17.

FIG. 21 is a view illustrating an example of a semiconductor light-emitting element disclosed in U.S. Pat. No. 6,329,667.

FIG. 22 is a view illustrating an example of a semiconductor light-emitting element disclosed in U.S. Pat. No. 9,184,344.

FIG. 23 is a view illustrating yet another example of an ultraviolet light-emitting semiconductor element according to the present disclosure.

FIG. 24 shows images showing a degree by which a V-shaped pit is formed according to a doping concentration.

FIG. 25 is a view illustrating an example of a semiconductor light-emitting chip in the form of a lateral chip.

FIG. 26 is a view illustrating an example of a semiconductor light-emitting chip in the form of a flip chip.

FIG. 27 is a view illustrating an example of a semiconductor light-emitting chip in the form of a vertical chip.

FIGS. 28 and 29 are views illustrating an example of a method of manufacturing a semiconductor light-emitting element including a non-wire bonding chip.

FIGS. 30 and 31 are views illustrating an example of a method of manufacturing a semiconductor light-emitting element disclosed in U.S. Patent Publication No. 2006-0202223.

FIGS. 32 to 40 are views illustrating a method of manufacturing a semiconductor light-emitting element disclosed in U.S. Pat. No. 10,263,140.

FIGS. 41 and 42 are views illustrating an example of a method of manufacturing a semiconductor light-emitting element according to the present disclosure.

FIGS. 43 and 44 are views illustrating a specific example of a semiconductor light-emitting element according to the present disclosure.

FIG. 45 shows views illustrating another specific example of a semiconductor light-emitting element according to the present disclosure.

MODES OF THE INVENTION

The present disclosure will now be described in detail with reference to the accompanying drawing(s).

FIG. 2 is a view illustrating an example of an ultraviolet light-emitting semiconductor element according to the present disclosure. Like that shown in FIG. 1, the ultraviolet light-emitting semiconductor element includes a growth substrate 10 (for example, sapphire), a high temperature grown AlN layer 20, a first semiconductor region 30 (for example, an n-type AlGaN layer), an active region 40 (for example, a multi-quantum well structure (MQWS) of AlGaN/AlGaN which generates light through recombination of electrons and holes, and a second semiconductor region 60 (for example, p-type (Al)GaN). Preferably, the ultraviolet light-emitting semiconductor element includes an electron blocking layer 50 (for example, p-type AlGaN). In addition, the ultraviolet light-emitting semiconductor element includes an inversion domain (ID) and inversion domain boundary (IDB) suppression layer 21, a low temperature grown AlN layer 22, and a high temperature grown $Al_xGa_{1-x}$ N (0.5≤x≤1) layer 23 between the high temperature grown AlN layer 20 and the first semiconductor region 30.

The ID and IDB suppression layer 21 may be made of an $Al_aN_bO_c$ composition by sputtering an AlN material in an oxygen ($O_2$) atmosphere or may be formed by performing oxygen surface treatment (plasma or annealing) on the high temperature grown AlN layer 20. In general, the high temperature grown AlN layer 20 is formed in a metal organic chemical vapor deposition (MOCVD) apparatus. An AlN/sapphire template is taken out from the MOCVD apparatus for oxygen surface treatment to be subjected to oxygen surface treatment, or $Al_aN_bO_c$ is directly deposited, and then other layers are grown inside the MOCVD apparatus again. (1) In an oxygen surface treatment which is an example process of the ID and IDB suppression layer 21, basically, exposure is performed at a high temperature of 500° C. or more for 10 minutes or more in an atmosphere of a small amount of oxygen, and preferably, radio frequency (RF) plasma is used in activating oxygen molecules to facilitate the formation of $Al_aN_bO_c$ on an AlN layer surface. (2) In $Al_aN_bO_c$ deposition which is another example process of the ID and IDB suppression layer 21, a film is directly formed with an $Al_aN_bO_c$ material through a physical vapor deposition (PVD) process including sputtering, or $Al_aN_bO_c$ is formed by depositing an AlN material in an oxygen atmosphere.

The AlN layer 22 grown at a relatively low temperature (850° C. or less) as compared with the high temperature grown AlN layer 20 serves to facilitate a surface of the ID and IDB suppression layer 21 to have an aluminum-polarity AlN layer without damaging the surface of the ID and IDB suppression layer 21. As an example, the low temperature grown AlN layer 22 is grown to have a thickness of 50 nm or less at a growth rate of 10 nm/min, a V/III ratio value of 3,000, a temperature of 550° C. to 850° C., and a flow rate of 7.5 μmol/min of a trimethylaluminum (TMAl) molybdenum (MO) source. In particular, forming a film in an atmosphere in which an aluminum (Al) composition is relatively higher than a nitrogen (N) composition is preferable to form a surface having aluminum (Al) polarity. In some cases, the low temperature grown AlN layer 22 may be deleted.

The high temperature grown $Al_xGa_{1-x}N$ (0.5≤x≤1) layer 23 provides a basis for growing the first semiconductor region 30 and also serves to minimize stress by adjusting a difference in lattice constant between the first semiconductor region 30 and AlN templates 10, 20, 21, 22, and 23 thereunder. As an example, a film is formed by adjusting a flow rate of an ammonia ($NH_3$) gas at a V/III ratio value of 200 to 40,000, a flow rate of 2 μmol/min to 60 μmol/min of a TMAl source, and a flow rate of 10 μmol/min to 40 μmol/min of a trimethylgallium (TMGa) MO source under conditions of a growth temperature of 1,100° C. or more and a low pressure (of 200 mbar or less).

When the high temperature grown $Al_xGa_{1-x}N$ (0.5≤x≤1) layer 23 is grown to a certain thickness or more, a V/III ratio is controlled according to a change in flow rate of an ammonia ($NH_3$) gas flow rate at a fixed flow rate (μmol/min) of a TMAl source and a TMGa MO source to repeat three-dimensional (3D) growth (when a growth rate in an out-plane (z-axis direction) of a growth surface is greater than a growth rate in an in-plane (x-y-axis direction) of the growth surface and two-dimensional (2D) growth (when a growth rate in an in-plane (x-y-axis direction) of a growth surface is greater than a growth rate in an out-plane (z-axis direction) of the growth surface, thereby forming a plurality of air voids. As an example, 3D growth is possible when a V/III ratio value is in a range of 400 to 800, and 2D growth is possible when a V/III ratio value is in a range of 50 to 200 which is greater than or equal to the range. Through repeated growth and a change in V/III ratio, it is possible to form the plurality of air voids and also control a size and density thereof. As a result, thermo-mechanical stress of a template including the high temperature grown $Al_xGa_{1-x}N$ (0.5≤x≤1) layer 23 and the entire growth substrate 10 is relaxed, thereby suppressing microcracks or the like.

After a basic nitridation or aluminum pre-flow (alumination) process is performed at a high temperature of 1,000° C. or more, as an example, a film of the high temperature grown AlN layer 20 may be formed on the sapphire growth substrate 10 by adjusting a flow rate of a TMAl MO source in a range of 10 μmol/min to 50 μmol/min and a flow rate of ammonia ($NH_3$) in a range of 900 sccm to 1,200 sccm at a growth rate of 1 μm/h under conditions of a growth temperature of 1,100° C., a low pressure (of 200 mbar or less), and a V/III ratio of 1,000 to 2,000.

In FIG. 2, the ultraviolet light-emitting semiconductor element according to the present disclosure is shown in the form of an epitaxial wafer. Like that shown in FIG. 1, the ultraviolet light-emitting semiconductor element may have the form of a lateral chip or flip-chip by forming a first ohmic electrode 70 (for example, Cr/Ni), a first pad electrode 75 (for example, Au), a current spreading electrode 80 (for example, a light-transmitting electrode (indium tin oxide (ITO)) or a reflective electrode (Al/Ni)), and a second pad electrode 85 (for example, Cr/Ni/Au or Au).

FIG. 3 is a view illustrating another example of an ultraviolet light-emitting semiconductor element according to the present disclosure. The ultraviolet light-emitting semiconductor element includes a high temperature grown AlN layer 24 between a low temperature grown AlN layer 22 and a high temperature grown $Al_xGa_{1-x}N$ ($0.5 \leq x \leq 1$) layer 23 in addition to the ultraviolet light-emitting semiconductor element shown in FIG. 2. As an example, a film is formed at a growth rate of 1 μm/h by adjusting a flow rate of a TMAl MO source in a range of 10 μmol/min to 50 μmol/min and a flow rate of ammonia ($NH_3$) in a range of 900 sccm to 1,200 sccm under conditions of a growth temperature of 1,100° C. or more, a low pressure (of 200 mbar or less), and a V/III ratio of 1,000 to 2,000. A V/III ratio may be controlled according to a change in flow rate of ammonia ($NH_3$) gas at a fixed flow rate (μmol/min) of a TMAl MO source to repeat 3D growth and 2D growth, thereby forming a plurality of air voids. As an example, 3D growth is possible when a V/III ratio value is in a range of 400 to 800, and 2D growth is possible when a V/III ratio value is in a range of 50 to 200 which is greater than or equal to the range. Through repeated growth and a change in V/III ratio, it is possible to form the plurality of air voids and also control a size and density thereof.

FIG. 4 is a view illustrating still another example of an ultraviolet light-emitting semiconductor element according to the present disclosure. The ultraviolet light-emitting semiconductor element includes a sacrificial layer 25 between a high temperature grown AlN layer 20 and an ID and IDB suppression layer 21 in addition to the ultraviolet light-emitting semiconductor element shown in FIG. 3. By providing the sacrificial layer 25, the ultraviolet light-emitting semiconductor element (epitaxial wafer) can be used in making a shape of a vertical chip structure. The sacrificial layer 25 is preferably removed using laser lift-off (LLO), and thus a growth substrate 10 is isolated from a plurality of semiconductor layers 25 to 60. Of course, the sacrificial layer 25 may be removed through wet etching. The sacrificial layer 25 may be grown through single or alternate stacking and growing of $AlN/Al_yGa_{1-y}N$ ($0 < y \leq 0.5$) and may have a thickness of 1 μm or less and preferably a thickness of 100 nm to 600 nm. The sacrificial layer 25 is grown by maintaining a growth temperature of 1,100° C. to 1,200° C., a V/III ratio of 2,000 to 3,000, a flow rate of 60 μmol/min to 80 μmol/min of a TMAl MO source, a flow rate of 6,000 sccm to 8,000 sccm of $NH_3$, and a growth rate of 1 μm/h. $Al_zGa_{1-z}N$ ($0.5 < z < 1$) may be substituted for AlN constituting the sacrificial layer 25.

FIG. 5 is a view illustrating yet another example of an ultraviolet light-emitting semiconductor element according to the present disclosure. Unlike the ultraviolet light-emitting semiconductor element shown in FIG. 4, the ultraviolet light-emitting semiconductor element includes a sacrificial layer 25 between a low temperature grown AlN layer 22 and a high temperature grown AlN layer 24. In this case, since the sacrificial layer 25 having an aluminum (Al) composition of 50% or less is formed as a single layer or multi-layer on the low temperature grown AlN layer 22 having an aluminum (Al) composition of 100%, the sacrificial layer 25 may cause a great difference between lattice constant values, thereby generating thermo-mechanical stress and also serving as an origin of generating various crystalline defects including an inversion domain (ID) or an inversion domain boundary (IDB) in an epitaxial structure of the ultraviolet light-emitting semiconductor element which has an aluminum (Al) composition of 50% or more and is subsequently grown on the sacrificial layer 25. By providing an ID and IDB suppression layer 21 and the low temperature grown AlN layer 21 below the sacrificial layer 25, it is possible to cope with such problems.

FIG. 6 is a view illustrating yet another example of an ultraviolet light-emitting semiconductor element according to the present disclosure. Unlike the ultraviolet light-emitting semiconductor element shown in FIG. 2, the ultraviolet light-emitting semiconductor element includes a sacrificial layer 25 at a position of a high temperature grown AlN layer 20. Accordingly, the sacrificial layer 25 performs not only a function of removing a growth substrate 10 but also a function of a seed for semiconductor layer growth. In addition, unlike the ultraviolet light-emitting semiconductor element shown in FIG. 3, the ultraviolet light-emitting semiconductor element includes the high temperature grown AlN layer 20 at a position of a high temperature grown AlN layer 24. An ID and IDB suppression layer 21 and a low temperature grown AlN layer 22 serve to suppress crystalline defects present in the sacrificial layer 25. Prior to the formation of the sacrificial layer 25, it is preferable that a nitridation or Al pre-flow (alumination) process is performed.

FIG. 7 is a view illustrating yet another example of an ultraviolet light-emitting semiconductor element according to the present disclosure. Unlike the ultraviolet light-emitting semiconductor element shown in FIG. 6, the ultraviolet light-emitting semiconductor element includes a sacrificial layer 25 between a low temperature grown AlN layer 22 and a high temperature grown AlN layer 20. Preferably, prior to the formation of an ID and IDB suppression layer 21, it is preferable that a nitridation or Al pre-flow (alumination) process is performed.

FIG. 8 is a view illustrating an example of a semiconductor light-emitting element disclosed in U.S. Pat. No. 10,263,140. The semiconductor light-emitting element (semiconductor chip form, that is, growth substrate-removed form) includes a first semiconductor region 30, an active region 40, a second semiconductor region 50, a bonding layer 90, a first electrical connection 93, and a support substrate 101 having a first electrical path 91 and a second electrical path 92. A plurality of semiconductor regions 30, 40, and 50 are in electrical communication with the first electrical path 91 and the second electrical path 92 through the bonding layer 90 and the first electrical connection 93. In a state in which the support substrate 101 is bonded to the plurality of semiconductor regions 30, 40, and 50 through the bonding layer 90, a growth substrate removal process (for example, LLO) is performed on the sacrificial layer 25 to isolate the growth substrate 10 shown in FIGS. 4 to 7 from the plurality of semiconductor regions 30, 40, 50 and the support substrate 101.

FIG. 9 is a view illustrating an example of a semiconductor light-emitting element in the form of a semiconductor chip according to the present disclosure. FIG. 9 shows a result in which a process applied in manufacturing the semiconductor light-emitting element shown in FIG. 8 is introduced to a semiconductor light-emitting element in a semiconductor epitaxial form shown in FIGS. 4 to 7. That is, a high temperature grown $Al_xGa_{1-x}N$ ($0.5 \leq x \leq 1$) layer 23 is provided on a first semiconductor region 30. After a sacrificial layer 25 is removed, a high temperature grown ALN layer 24, a low temperature grown Aln layer 22, an ID and IDB suppression layer 21, and a high temperature grown ALN layer 20, which are left, are removed. As an example, after the sacrificial layer 25 and a growth substrate 10 made of sapphire are removed through an LLO process, the high temperature grown AlN layer 24, the low temperature grown AlN layer 22, the IDB suppression layer 21, and the high temperature grown AlN layer 20 are completely removed through a dry etching process until the high temperature grown $Al_xGa_{1-x}N$ ($0.5 \leq x \leq 1$) layer 23 is exposed. Argon (Ar), chlorine ($Cl_2$), and chlorine boride ($BCl_3$) gases are introduced into a chamber of an inductively coupled plasma reactive ion etching (ICP-RIE) dry etching apparatus at room temperature ($25°$ C.), and while a total flow rate of 45 sccm is maintained, an Ar flow rate is adjusted to 10 sccm or less to adjust $Cl_2$ and $BCl_3$ flow rates at an appropriate ratio, thereby performing etching to have a flat surface.

In order to minimize crystalline defects including an ID or an IDB, such as vacancies, dislocations, stacking faults, or nanopipes, it is preferable that the high temperature grown $Al_xGa_{1-x}N$ ($0.5 \leq x \leq 1$) layer 23 is made of a high resistance insulator that does not include intentionally introduced impurities or dopants (Si or Mg). In addition, it is preferable that a rough surface 23S for increasing light extraction efficiency is formed on the high temperature grown $Al_xGa_{1-x}N$ ($0.5 \leq x \leq 1$) layer 23. If necessary, a low refractive index material 23P such as $SiO_2$, $Al_2O_3$, AlON, MgF, or CaF may be additionally formed on the high temperature grown $Al_xGa_{1-x}N$ ($0.5 \leq x \leq 1$) layer 23 through a PVD or chemical vapor deposition (CVD) method. The high temperature grown $Al_xGa_{1-x}N$ ($0.5 \leq x \leq 1$) layer 23, from which crystalline defects such as an ID or an IDB are minimized, serves as a support such that a first semiconductor region 30, an active region 40, and a second semiconductor region 50, which are core regions of a semiconductor light-emitting element (semiconductor chip form, that is, growth substrate-removed form), may maintain structural safety from a mechanical impact that may occur during an LLO process and also minimizes crystalline defects including an ID or an IDB during a growth process to assist in preventing epitaxy of the semiconductor light-emitting element from being destroyed when a high current is applied.

The low refractive index material 23P serves to assist ultraviolet light (photon), which is generated in a semiconductor light-emitting element (semiconductor chip form, that is, growth substrate-removed form) having a high refractive index of 2.0 or more, to be relatively easily extracted into the air (having a refractive index of 1.1). In particular, it is preferable that a film is formed with a material having a value smaller than a refractive index of the high temperature grown $Al_xGa_{1-x}N$ ($0.5 \leq x \leq 1$) layer 23.

FIG. 10 is a view illustrating a specific example of the semiconductor light-emitting element shown in FIG. 9. A first electrical path 91 is electrically connected to a first semiconductor region 30 through a bonding layer 90, and a second electrical path 92 is electrically connected to a second semiconductor region 50 through a first electrical connection 93. Reference numerals 110 and 111 denote insulating layers, and reference numeral 94 denotes a first conductive layer. Of course, a rough surface 23S and a low refractive index material 23P may be provided.

FIG. 11 is a view illustrating another specific example of the semiconductor light-emitting element shown in FIG. 9. A first electrical path 91 is electrically connected to a second semiconductor region 50 through a bonding layer 90, and a second electrical path 92 is electrically connected to a first semiconductor region 30 through a first electrical connection 93. The first electrical connection 93 is formed on the first semiconductor region 30 exposed by removing a portion of a high temperature grown $Al_xGa_{1-x}N$ ($0.5 \leq x \leq 1$) layer 23. Reference numeral 110 denotes an insulating layer, and reference numeral 95 denotes a second conductive layer. Of course, a rough surface 23S and a low refractive index material 23P may be provided.

FIG. 12 is a view illustrating still another specific example of the semiconductor light-emitting element shown in FIG. 9. Unlike the semiconductor light-emitting element shown in FIG. 10, a first electrical path 91 and a second electrical path 92 are not provided in a support substrate 101, and an opening is formed in an insulating layer 111 to form a second electrical connection 96. A first electrical connection 93 is electrically connected to a second semiconductor region 50 through a first conductive layer 94, and the second electrical connection 96 is electrically connected to a first semiconductor region 30 through a bonding layer 90. The first electrical connection 93 and the second electrical connection 96 serve as bonding pads for wire bonding.

FIG. 13 is a view illustrating yet another specific example of the semiconductor light-emitting element shown in FIG. 9. Unlike the semiconductor light-emitting element shown in FIG. 12, a first electrical connection 93 is electrically connected to a second semiconductor region 50 through a second conductive layer 95, and a second electrical connection 96 passes through a high temperature grown $Al_xGa_{1-x}N$ ($0.5 \leq x \leq 1$) layer 23 to be electrically connected to a first semiconductor region 30. It is preferable that the second electrical connection 96 leads to a region having the highest doping concentration in the first semiconductor region 30. The first electrical connection 93 and the second electrical connection 96 serve as bonding pads for wire bonding.

FIG. 14 is a view illustrating yet another example of an ultraviolet light-emitting semiconductor element according to the present disclosure. The ultraviolet light-emitting semiconductor element has a configuration similar to that of the ultraviolet light-emitting semiconductor element shown in FIG. 5, but a first AlGaN region A is provided instead of a low temperature grown AlN layer 22, and a second AlGaN region B is provided between a sacrificial layer 25 and a high temperature grown AlN layer 24. In the present example, a high temperature grown AlN layer 20 is referred to as a first AlN layer 20, the high temperature grown AlN layer 24 is referred to as a second AlN layer 24, and a high temperature grown $Al_xGa_{1-x}N$ ($0.5 \leq x \leq 1$) layer 23 is simply referred to as an $Al_xGa_{1-x}N$ ($0.5 \leq x \leq 1$) layer 23. When an LLO process is used to remove a sacrificial layer 25, for example, when a laser light source having a wavelength of 248 nm is used and the sacrificial layer 25 has a multi-layered structure of $AlN/Al_yGa_{1-y}N$, a y composition of the sacrificial layer 25 is designed to have a value of 0.55 or less. In this case, a total difference in aluminum (Al) composition between the first and second AlN layers 20 and 24 and the sacrificial layer 25 is greater than or equal to 20%, which causes an abrupt quality degradation issue, that is, a large amount of crystalline defects such as misfit dislocations (MDs) on the sacrificial layer 25, that is, in the second AlN layer 24, the $Al_xGa_{1-x}N$ ($0.5 \leq x \leq 1$) layer 23, and a first semiconductor region 30 (Defect reduced AlN and AlGaN as basic layers for UV LEDs by Viola and Kuller, https://depositonce.tu-berlin.de/handle/11303/4320).

While the above examples approach an improvement in element from the viewpoint of generation and suppression of an ID or an IDB, the present example is directed to improving the performance of an element by introducing a first AlGaN region A and a second AlGaN region B from the viewpoint of a thermal expansion coefficient and thermo-mechanical stress. That is, the first AlGaN region A is formed as a multi-layer between the first AlN layer 20 and the sacrificial layer 25 and serves to prevent an aluminum (Al) composition from being abruptly changed by 20% or more, and the second AlGaN region B is formed as a multi-layer between the sacrificial layer 25 and the second AlN layer 24 and serves to prevent an aluminum (Al) composition from being abruptly changed by 20% or more. For example, when the first AlGaN region A is formed as three layers, a first layer A1 in contact with the first AlN layer 20 has an aluminum (Al) composition of 80% or more, a third layer A3 in contact with the sacrificial layer 25 has an aluminum (Al) composition difference of less than 20% from the sacrificial layer 25, and a second layer A2 provided between the first layer A1 and the third layer A3 has an aluminum (Al) composition difference of less than 20% from each of the first layer A1 and the third layer A3. When three layers are insufficient, four or more layers may be provided, and when a condition is satisfied with two layers, two layers are sufficient. In summary, the first AlGaN region A is formed as multiple layers, a side thereof in contact with the first AlN layer 20 has an aluminum (Al) composition difference of less than 20% from the first AlN layer 20, and a side thereof in contact with the sacrificial layer 25 has an aluminum (Al) composition difference of less than 20% from the sacrificial layer 25. Thus, the first AlGaN region A is formed as multiple layers of which each layer has an aluminum (Al) composition difference of less than 20%. When the second AlGaN region B is formed as three layers, a first layer B1 in contact with the sacrificial layer 25 has an aluminum (Al) composition of less than 20%, a third layer B3 in contact with the second AlN layer 24 has an aluminum (Al) composition difference of less than 20% from the second AlN layer 24, and a second layer B2 provided between the first layer B1 and the third layer B3 has an aluminum (Al) composition difference of less than 20% from each of the first layer B1 and the third layer B3. In summary, the second AlGaN region B is formed as multiple layers, a side thereof in contact with the sacrificial layer 25 has an aluminum (Al) composition difference of less than 20% from the sacrificial layer 25, and a side thereof in contact with the second AlN layer 24 has an aluminum (Al) composition difference of less than 20% from the second AlN layer 24. Thus, the second AlGaN region B is formed as multiple layers of which each layer has an aluminum (Al) composition difference of less than 20%. Each layer A1, A2, A3, B1, B2, or B3 made of a ternary compound (AlGaN) may be formed through MOCVD using binary AlN and GaN compounds fundamentally having opposite vapor chemical properties at a high temperature of 900° C. or more and a low pressure of 50 Torr to 200 Torr in a high V/III ratio atmosphere including a large amount of ammonia (NH₃) gas. A thickness of each layer A1, A2, A3, B1, B2, or B3 may be designed in consideration of a thickness introduced into an interface at which crystalline defects are generated, that is, a critical thickness (T$_c$). When the second AlN layer 24 is omitted, the second AlGaN region B is formed between the sacrificial layer 25 and the Al$_x$Ga$_{1-x}$N (0.5≤x≤1) layer 23 while the same condition is satisfied. The first AlGaN region A has a form in which an aluminum (Al) composition gradually decreases upward, the second AlGaN region B has a form in which an aluminum Al composition gradually decreases downward, and it is more preferable that the first AlGaN region A and the second AlGaN region B are formed symmetrically with each other to be in a balance with each other in thermo-mechanical stress. The first AlGaN region A and the second AlGaN region B have a symmetrical structure with respect to the sacrificial layer 25 to relax or adjust tensile and compressive stresses due to a lattice constant and a thermal expansion coefficient, thereby preventing cracks. As described above, it is preferable that the Al$_x$Ga$_{1-x}$N (0.5≤x≤1) layer 23 is intentionally undoped, and of course, an ID and IDB suppression layer 21 may be provided. The first semiconductor region 30, an active region 40, an electron blocking layer 50, and a second semiconductor region 60 constitute an emission part. As described above, the first AlN layer 20 may include nanoscale voids (holes, pores, or trenches) for relaxing tensile stress or is subjected to a high-temperature heat treatment process before growth to introduce nanoscale surface roughness on a sapphire surface. On the other hand, it is preferable that the second AlN layer 24 does not include nanoscale voids (holes, pores, or trenches), and this is because, when the second AlN layer 24 is left in a final element, and nanoscale voids (holes, pores, or trenches) are present in the left second AlN layer 24, the nanoscale voids perform a reverse function of absorbing light.

FIG. 15 is a view for describing a fluctuation in curvature during growth of the ultraviolet light-emitting semiconductor element shown in FIG. 14. While the first AlN layer 20 is grown, a curvature approaches to a critical value (50/km) at which cracks occur so that a growth substrate 10 (see FIG. 14) has a concave shape. The growth substrate 10 has a concave shape to be less bent while the first AlGaN region A is grown, has a convex shape while the sacrificial layer 25 is grown, and has a shape close to a flat surface while the second AlN layer 24 is grown. Such a behavior of the curvature shows a role of the second AlN layer 24 well from the viewpoint of thermo-mechanical stress. Since the second AlN layer 24 is provided, it can be seen that upper layers including the Al$_x$Ga$_{1-x}$N (0.5≤x≤1) layer 23 may be grown in a much flatter state than when the upper layers are simply grown by providing only the first AlN layer 24 and the sacrificial layer 25. The growth substrate 10-first AlGaN region A-sacrificial layer 25-second AlGaN region B-second AlN layer 24 may be regarded as one template for AlN-based nitride growth. In this case, a thickness of the second AlN layer 24 may be 3 µm or more, and the second AlN layer 24 may be grown to 3 µm or more to annihilate crystalline defects such as dislocation leading from the growth substrate 10, thereby forming a template having a low density of defects. When an x value of an aluminum composition of the A$_x$Ga$_{1-x}$N (0.5≤x≤1) layer 23 is close to 1, the second AlN layer 24 may be omitted, but from the viewpoint of the behavior of the curvature shown in FIG. 15, it is preferable that the second AlN layer 24 is provided. The Al$_x$Ga$_{1-x}$N (0.5≤x≤1) layer 23 also serves to reduce a difference in aluminum composition between the first semiconductor region 30 grown thereon and the second AlN layer 24.

From the viewpoint of a behavior of curvature, without any change, the ultraviolet light-emitting semiconductor element shown in FIG. 15 may be applied to a flip chip as well as a vertical chip from which the growth substrate 10 is removed, and in this case, the sacrificial layer 25 may serve as a stress adjustment layer (for reducing an aluminum (Al) composition to relax stress) and may be referred to as the stress adjustment layer. Of course, the sacrificial layer 25 also serves as a stress adjustment layer in the vertical chip. However, since the stress adjustment layer 25 is not finally removed in the flip chip, there is a risk of absorbing ultraviolet light generated in the active region 40, and thus it is preferable that the stress adjustment layer 25 is formed as a single layer or a multi-layer so as to have a higher aluminum (Al) composition than the active region 40. Meanwhile, in a case in which it is assumed that the stress adjustment layer 25 is made of AlN/Al$_y$Ga$_{1-y}$N (0<y≤0.5) (of course, the stress adjustment layer 25 may be formed as a single layer of AlGaN and a multi-layer of AlGaN/

AlGaN), when an aluminum (Al) composition is higher than that of the sacrificial layer 25 of the vertical chip, a degree of blow of the convex shape of the growth substrate 10 will be relieved than when the sacrificial layer 25 is grown in FIG. 15, which also contributes to improve the quality of layers thereon.

FIGS. 16 and 17 are views illustrating an example of a method of manufacturing an aluminum nitride (AlN) template according to the present disclosure. Unlike that shown in FIG. 14, a sacrificial layer 25 is not provided below a second AlN layer 24. Therefore, a second AlGaN region B is not required to overcome differences in lattice constant and thermal expansion coefficient between the second AlN layer 24 and the sacrificial layer 25, and a first AlGaN region A is not required. Even in this case, a template, which includes the second AlN layer 24 which is crack-free and has a low density of defects (for example, a middle threading dislocation density (TDD) of $10^8$ cm$^{-2}$ or a low TDD of $10^9$ cm$^{-2}$) by annihilating crystalline defects such dislocation leading from a growth substrate 10 (for example, sapphire or SiC), is required without any change. In the example shown in FIG. 3, from the viewpoint of generation and suppression of an ID or an IDB, a method of providing an ID and IDB suppression layer 21 and a low temperature grown AlN layer 22 between a first AlN layer 20 and the second AlN layer 24 is provided. In the present example, a method of manufacturing an aluminum nitride (AlN) template including the second AlN layer 24 with a thickness of 3 µm or more is provided from the viewpoint of relaxation or adjustment of tensile and compressive stress.

First, as shown in FIG. 16, a method of forming the second AlN layer 24 on the first AlN layer 20 is described. In this case, as described above, a method of relaxing tensile stress has been proposed in the prior art through (1) a method of forming a plurality of air voids in the first AlN layer 20 by adjusting growth conditions in a process of forming a film, (2) a method of, before a film is formed, manufacturing a periodical nanoscale patterning sapphire substrate (NPSS) on a surface of a growth substrate 10 through an ex-situ photolitho process and then forming the first AlN layer 20, (3) a method of depositing a sputtered AlN material into a seeding layer on the growth substrate 10 and then performing a high-temperature heat treatment process (HTA) at a temperature of 1,600° C. or more, or (4) a method of promoting lateral growth by injecting a small amount of gallium (Ga) component (3% or less) (for serving as a surface surfactant) into AlN in a process of forming a film. However, when only such methods or a combination thereof is applied, it is not easy to prevent cracks and secure a low density of defects when a thickness of the second AlN layer 24 exceeds a critical thickness (about 1.5 µm) and becomes 3 µm or more required to provide an AlN template allowing a stable film to be formed.

The paper (Fabrication of crack-free AlN film on sapphire by hydride vapor phase epitaxy using an in situ etching method by Xue-Hua Liu et al., Applied Physics Express 9, 045501 (2016)) discloses a method of 1) forming a first AlN layer 20 at a temperature of 1,400° C. using a hydride vapor phase epitaxy (HVPE) method, 2) forming a plurality of air voids through etching (at a temperature of 1,550° C. for 2 minutes in a hydrogen (H₂) gas atmosphere), and then 3) forming a second AlN layer 24 again at a temperature of 1,400° C. to manufacture an AlN template having a total thickness of 5 µm. By using such a method, it is possible to prevent cracks of the second AlN layer 24 as well as to reduce crystalline defects in the AlN template.

However, the method applied in the paper uses the HYPE method and is not easy to apply to a MOCVD method. In addition, in order to etch an AlN thin film material grown at a high temperature of 1,200° C. or more, an etching temperature (Te) of 1,300° C. or more, which is higher than a film forming temperature (Tg) of 1,200° C. or more, has been used, and in the case of the MOCVD method, it is not practically easy to apply an etching temperature (Te), which is higher than a film forming temperature (Tg) of AlN by 100° C., to a commercial MOCVD apparatus, wherein the AlN is grown at a high temperature of 1,200° C. or more.

In FIG. 17, an $Al_{1-v}Ga_vN$ ($0<v<1$) layer 20a is provided instead of the first AlN layer 20. The $Al_{1-v}Ga_vN$ ($0<v<1$) layer 20a may have a porous structure having the same function as a plurality of air voids and may be referred to as a porous $Al_{1-v}Ga_vN$ ($0<v<1$) layer 20a. Hereinafter, the second AlN layer 24 is simply referred to as an AlN layer 24. If necessary, a seed layer 20b (nucleation layer) serving as a seed may be further included between the growth substrate 10 and the $Al_{1-v}Ga_vN$ ($0<v<1$) layer 20a. AlInN or AlGaInN may be used instead of AlGaN, and the $Al_{1-v}Ga_vN$ ($0<v<1$) layer 20a may extend into an $Al_{1-v-w}Ga_vIn_wN$ ($0≤v<1$, $0≤w<1$, and $v+w<1$) layer 20a. A first semiconductor region 30, an active region 40, an electron blocking layer 50, and a second semiconductor region 60, which constitutes an ultraviolet light-emitting semiconductor element as in FIG. 14 as an example of an element that can be mounted on AlN templates 10, 20a, and 24, are formed on the AlN layer 24.

When AlGaN is grown directly on the growth substrate 10 or on a growth substrate/AlN (thin film) instead of the first AlN layer 20, it is possible to obtain 1) an effect of suppressing tensile stress causing cracks by increasing an n-plane (C Plane) lattice constant (a) (substituting a portion of Al with Ga), that is, a primary effect of strengthening compressive stress inside AlGaN grown on the growth substrate, 2) a secondary effect of relaxing tensile stress in an AlGaN thin film or thick film consecutively grown after porous AlN or porous AlGaN is formed through a gallium decomposition & evaporation process inside the grown AlGaN (wherein a total composition amount of gallium (Ga) in the porous AlN or porous AlGaN is much less than a composition amount of gallium (Ga) in the grown AlGaN), and a tertiary effect of suppressing or minimizing deep UV light absorption using the concept of the present disclosure while, when a Ga-rich AlGaN thin film with a higher composition of Ga than an AlGaN material constituting a multi-quantum well (MQW) is grown, there is an adverse effect of absorbing generated deep UV light.

FIG. 18 shows views illustrating an example of the method of manufacturing an aluminum nitride (AlN) template shown in FIG. 17. First, as shown in FIG. 18A, an $Al_{1-v}Ga_vN$ ($0<v<1$) layer 20c is formed on a growth substrate 10 (for example, sapphire or SiC). As described above, a seed layer 20b (nucleation layer) may be provided between the growth substrate 10 and the $_{Al1-v}Ga_vN$ ($0<v<1$) layer 20c.

In the case of in-situ AlN, a growth temperature of the seed layer 20b (nucleation layer) may be preferably a high temperature of 900° C. or more and may be within a range of 500° C. to 1,300° C., and a chamber growth pressure thereof may be preferably as low as possible and may be within a range of 20 mbar to 200 mbar. Before the seed layer 20b is formed on the growth substrate 10, it is preferable that AlN islands having a 3D shape are formed directly on the growth substrate, that is, a 3D growth mode is preferable. To this end, it means that a film is formed at a relatively large V/III ratio (for example, 200 or more), that is, in an atmosphere of a large amount of ammonia gas ($NH_3$-rich ambiance) rather than an atmosphere of a large amount of aluminum gas (Al-rich ambiance) inside a MOCVD chamber. In order to complete the AlN seed layer 20b having a certain thickness in a subsequent process after forming the AlN Islands having the 3D shape, it is preferable that a film is formed at a relatively small V/III ratio (for example, less than 200). In other words, it means that the film is formed in an atmosphere of a large amount of aluminum gas (Al-rich ambiance) rather than an atmosphere of a large amount of ammonia gas ($NH_3$-rich ambiance) in the MOCVD chamber. A thickness of the seed layer 20b made of AlN is preferably 200 nm or less. In the case of ex-situ AlN(O), it is preferable that an AlNO material including AlN or a small amount of oxygen ($O_2$) is formed into a film of the seed layer 20b having a thickness of 50 nm or less at a temperature of 200° C. to 700° C. in a sputtering system.

A film of an $Al_{1-v}Ga_vN$ (0<v<1) layer 20c may be formed on the growth substrate 10 or the seed layer 20b. In a growth process, core adjustment parameters that determine a degree of a wafer bow, growth substrate nitridation, ammonia ($NH_3$) flow, and TMGa flow injected and added to aluminum (Al) flow are appropriately adjusted. In addition, when a film of the seed layer 20b is formed through in-situ or ex-situ, since a thickness of the seed layer 20b has a great influence on a wafer blow, the thickness of the seed layer 20b should be appropriately adjusted such that an excessive wafer bow does not occur. Basic growth conditions may be a temperature of 1,100° C. or less and a pressure of 200 mbar or less, and for example, a film of the $Al_{1-v}Ga_vN$ (0<v<1) layer 20c may be formed at a growth rate of 0.5 um/h to 2 um/h at a growth temperature of 1,050° C. and a growth pressure of 100 mbar Rather than specifying a thickness of the $Al_{1-v}Ga_vN$ (0<v<1) layer 20c and a composition amount of gallium (Ga), it is more important to form a film by applying a principle in which a thickness is relatively decreased when a composition amount of injected and added gallium (Ga) is increased, and a thickness is relatively increased when a composition amount of injected and added gallium (Ga) is decreased.

When an $Al_{1-v-w}Ga_vIn_wN$ (0≤v<1, 0≤w<1, and v+w<1) layer 20c is used, unlike the formation of a film of the $Al_{1-v}Ga_vN$ layer 20c, since an indium (In) component having smaller chemical bonding energy (eV) than aluminum (Al) and gallium (Ga) is injected and added, a growth temperature should be significantly lowered. Basic growth conditions may be a temperature of 1,100° C. or less and a pressure of 200 mbar or less, and for example, a film of the $Al_{1-v-w}Ga_vIn_wN$ (0≤v<1, 0≤w<1, and v+w<1) layer 20c may be formed at a growth rate of 0.5 um/h to 2 um/h at a growth temperature of 900° C. and a growth pressure of 100 mbar. Rather than specifying a thickness of the $Al_{1-v-w}Ga_vIn_wN$ (0≤v<1, 0≤w<1, and v+w<1) layer 20c and a composition amount of gallium (Ga), it is more important to form a film by applying a principle in which a thickness is relatively decreased when composition amounts of injected and added gallium (Ga) and indium (In) are increased, and a thickness is relatively increased when composition amounts of injected and added gallium (Ga) and indium (In) are increased.

Next, as shown in FIG. 18B, a plurality of voids V are formed in the $Al_{1-v}GavN$ (0<v<1) layer 20c (see FIG. 18A) so that the $Al_{1-v}Ga_vN$ (0<v<1) layer 20c becomes a porous $Al_{1-v}Ga_vN$ (0<v<1) layer 20a. The plurality of voids V may be formed by decomposing the $Al_{1-v}Ga_vN$ (0<v<1) layer 20c through etching at an etching temperature (Te) higher than a growth temperature (Tg) of the $Al_{1-v}Ga_vN$ (0<v<1)

layer 20c or the porous $Al_{1-v}Ga_vN$ (0<v<1) layer 20a. Etching may be performed in a gas atmosphere including hydrogen ($H_2$), and the plurality of nanoscale voids V may be formed through a gallium (Ga) evaporation process. The plurality of voids V formed through etching may have a depth in the entirety of the porous the $Al_{1-v}Ga_vN$ (0<v<1) layer 20a or may have a depth at only a portion of the porous the $Al_{1-v}Ga_vN$ (0<v<1) layer 20a, which may depend on etching conditions. A composition v of Ga in the porous $Al_{1-v}Ga_vN$ (0<v<1) layer 20a left through etching may depend on a composition v of Ga in the $Al_{1-v}Ga_vN$ (0<v<1) layer 20c and etching conditions, and the porous $Al_{1-v}Ga_vN$ (0<v<1) layer 20a may be formed to have a composition close to AlN. Although it is most preferable that an AlN material layer, which includes the plurality of voids V without any gallium (Ga) and/or indium (In) component, is formed, in order to minimize light absorption, an amount of a gallium (Ga) and/or indium (In) component should be less than that of a gallium (Ga) and/or indium (In) component included in an MQW of a light-emitting element such as an light-emitting diode (LED) or a laser diode (LD) of which a film is subsequently formed. As an example, when a film of the $Al_{1-v}Ga_vN$ (0<v<1) layer 20c is formed at a temperature of 1,050° C. and a low pressure of 100 mbar, etching may be performed at a temperature of 1,150° C. and a pressure of 50 mbar in a hydrogen ($H_2$) atmosphere including hydrogen ($H_2$) alone or a certain amount of ammonia ($NH_3$)

Finally, as shown in FIG. 18C, an AlN layer 24 is grown on the porous the $Al_{1-v}Ga_vN$ (0<v<1) layer 20a. Growth conditions of the AlN layer 24 may vary according to two cases according to the purpose of use as follows.

First, in order to further strengthen a 3D growth mode (rough surface) to control cracks through further tensile stress relief and to increase a thickness of a film of an AlN template that is subsequently formed, (1) it is preferable that a growth temperature is set to be 1,100° C. or less and a V/III ratio value is set to be relatively low, or (2) it is preferable that a growth temperature is set to be 1,300° C. or more and a V/III ratio value is to be relatively high. A thickness is preferably in a range of 100 nm to 3.5 μm.

Next, in order to further strengthen a 2D growth mode (smooth surface) to smooth a surface, (1) it is preferable that a growth temperature is set to 1,300° C. or more and a V/III ratio value is set to be relatively low, or (2) it is preferable that a growth temperature is set to 1,100° C. or less and a V/III ratio value is to be relatively high. A thickness is preferably in a range of 10 nm to 2 μm.

FIG. 19 shows views illustrating another example of the method of manufacturing an aluminum nitride (AlN) template shown in FIG. 17. As shown in FIG. 19A, after a porous $Al_{1-v}Ga_vN$ (0<v<1) layer 20a-1 is formed, an $Al_{1-v}Ga_vN$ (0<v<1) layer 20c-2 is formed again. Next, as shown in FIG. 19B, a porous $Al_{1-v}Ga_vN$ (0<v<1) layer 20a-2 is formed through etching. Such a process is repeated as many times (n) as necessary, and then an AlN layer 24 is formed as shown in FIG. 19C. Decomposition and evaporation of gallium (Ga) of each layer 20c-1 or 20c-2 may be controlled to increase an aluminum (Al) composition of each layer 20c-1 or 20c-2 as each layer 20c-1 or 20c-2 is closer to the AlN layer 24. Although the number of repetitions is not particularly limited, the number of repetitions is determined in consideration of crystallinity of an AlN thin film. In particular, repetition may be performed until both spectrum peak full widths at half maximum (FWHM) of an X-ray rocking curves (XRCs) of AlN (0002) and AlN (102) have a value of 300 arcsec or less. Basic growth conditions may be a temperature of 1,100° C. or less and a low pressure of 200 mbar or less, and for example, a film of an $Al_{1-v}Ga_vN$ (0<v<1) layer 20c is formed at a growth rate of 0.5 um/h to 2 um/h at a growth temperature of 1,050° C. and a growth pressure of 100 mbar. Rather than a thickness of the $Al_{1-v}Ga_vN$ (0<v<1) layer 20c and a composition amount of gallium (Ga) being specified, a thickness is relatively decreased when a composition amount of injected and added gallium (Ga) is increased, and a thickness is relatively increased when a composition amount of injected and added gallium (Ga) is decreased. As an example, when the film of the $Al_{1-v}Ga_vN$ (0<v<1) layer 20c is formed at a temperature of 1,050° C. and a low pressure of 100 mbar, etching may be performed at a temperature of 1,150° C. and a pressure of 50 mbar in a hydrogen ($H_2$) atmosphere including hydrogen ($H_2$) alone or a certain amount of ammonia ($NH_3$)

FIG. 20 shows views illustrating still another example of the method of manufacturing an aluminum nitride (AlN) template shown in FIG. 17. As shown in FIG. 20A, after a porous $Al_{1-v}Ga_vN$ (0<v<1) layer 20a-1 and an AlN layer 24-1 are formed, an $Al_{1-v}Ga_vN$ (0<v<1) layer 20c-2 is formed again. Next, in FIG. 20B, a porous $Al_{1-v}Ga_vN$ (0<v<1) layer 20a-2 is formed through etching. Then, as shown in FIG. 20C, an AlN layer 24-2 is formed again. Such a process is repeated as many times as necessary. Finally, an $n^{th}$ AlN layer 24-n that is finally formed is formed to be thicker than previous AlN layers 24-1 to 24-n−1, thereby constituting an AlN template. For the formation of films of the porous $Al_{1-v}Ga_vN$ (0<v<1) layer 20a-1 and the porous $Al_{1-v}Ga_vN$ (0<v<1) layer 20a-2, film forming conditions and the number of repetitions shown in FIG. 19 may be used without any change, and thicknesses of the AlN layer 24-1 and the $n^{th}$ AlN layer 24-n may be adjusted in consideration of thicknesses of all AlN layers. The AlN layers 24-1 to 24-n−1 may be referred to as AlN interlayers, and each of the AlN interlayers 24-1 to 24-n−1 may have a thickness of, for example, 100 nm or less.

FIG. 23 is a view illustrating yet another example of an ultraviolet light-emitting semiconductor element according to the present disclosure. The ultraviolet light-emitting semiconductor element includes a growth substrate 10 (for example, sapphire), a buffer layer 20a (for example, a high temperature grown AlN layer 20), a first semiconductor region 30 (for example, a single layer of n-type $Al_nGa_{1-n}N$ (x<n) or a single or multi-pair of n-type $AlnGa_{1-n}N/Al_uGa_{1-u}N$ (x<n<u)), and a V-shaped pit generation layer 31 (for example, a single layer of AlN or $Al_eGa_{1-e}N$ (x<e and 0.5≤e<1) or a single or multi-pair of $Al_zGa_{1-z}N/Al_jGa_{1-j}N$ (x<z<j≤1). A total Al content of the V-shaped pit generation layer 31 is 50% or more, a doping concentration of a dopant (for example, Si) thereof is in a range of $6×10^{18}/cm^3$ to $5×10^{19}/cm^3$, and a thickness thereof is in a range of 50 nm to 500 nm. There is a difficulty in adjusting a size of a V-shaped pit V to be 200 nm or more in high-quality Al-rich AlGaN and AlN thin films. A position of the V-shaped pit generation layer 31 is very important, and it is preferable that the position is set to 500 nm or less from a lower end of an active region (MQW). The ultraviolet light-emitting semiconductor element includes a second semiconductor region 60 and an active region 40 which generates light through recombination of electrons and holes (for example, 2 to 6 pairs of $Al_xGa_{1-x}N/AlyGa_{1-y}N$ (x<y) MQWSs such as a well layer having a thickness of 1 nm to 5 nm and a barrier layer having a thickness of 1.5 nm to 10 nm thick. Preferably, the ultraviolet light-emitting semiconductor element includes an electron blocking layer 50 (for example, a single layer of $Al_hGa_{1-h}N$ (y<h) or a single or multi-pair of $AlhGa_{1-h}N/Al_gGa_{1-g}N$ (y<h<g)). If necessary, the buffer layer 20a may further include AlN 20b configured to serve as a seed and a dislocation filtering layer 20c (for example, a single or multi-pair of $AlmGa_{1-m}N/A_sGa_{1-s}N$ (n<m<s≤1)), and of course, the buffer layer 20a may be formed as a combination of the high temperature grown AlN layer 20, the ID and IDB suppression layer 21, the low temperature grown AlN layer 22, the high temperature grown $Al_xGa_{1-x}N$ (0≤x≤0.5) layer 23, the high temperature grown AlN layer 24, and the sacrificial layer 25 shown in FIGS. 2 to 7. In addition, a first spacer layer 32 (for example, undoped $Al_pGa_{1-p}N$ (0.5<p) having a thickness of 20 nm to 60 nm) may be provided between the V-shaped pit generation layer 31 and the active region 40, and a second spacer layer 52 (for example, undoped $Al_qGa_{1-q}N$ (p<q) having a thickness of 10 nm to 50 nm) may be provided between the active region 40 and the electron blocking layer 50. The second semiconductor region 60 may include a first hole injection layer 60a (for example, a single layer of p-type $Al_iGa_{1-i}N$ (x<i<h) or a single or multi-pair of p-type $Al_iGa_{1-i}N/Al_vGa_{1-v}N$ (x<i<v<<h)), a second hole injection layer 60b (for example, a single layer of p-type $Al_kGa_{1-k}N$ (x<k<i) or a single or multi-pair of p-type $Al_kGa_{1-k}N/Al_wGa_{1-w}N$ (x<k<w<i)), and a second contact layer 60c. The second contact layer 60c (for example, a single layer of p-type $Al_oGa_{1-o}N$ (x<o) or a single or multi-pair of p-type $Al_oGa_{1-o}N/Al_fGa_{1-f}N$ (x<o<f)) is a layer in contact with a second electrode 82 (see FIG. 22). From this point of view, the first semiconductor region 30 may be referred to as a first contact layer because the first semiconductor region 30 is in contact with a first electrode 81 (see FIG. 22). The ultraviolet light-emitting semiconductor element shown in FIG. 23 may have the form of a lateral chip, a flip chip, or a vertical chip, and of course, may have the form shown in FIGS. 9 to 13. The V-shaped pit V may be generated from the V-shaped pit generation layer 31 to lead to the active region 40 and the current blocking layer 50. For example, the V-shaped pit V may be formed to have a depth of, for example, 50 nm to 500 nm and may be filled with the first hole injection layer 60a. Of course, the current blocking layer 50 may fill the V-shaped pit V. When the V-shaped pit generation layer 31 (for example, a single layer of AlN or $Al_eGa_{1-e}N$ (x<e and 0.5≤e<1) or a single or multi-pair of $Al_zGa_{1-z}N/Al_jGa_{1-j}N$ (x<z<j≤1)), a total Al content of 50% or more, a doping concentration of a dopant (for example, Si) in a range of 6×10 18 to 5×10 19/cm 3, and a thickness in a range of 50 nm to 500 nm) is a single layer, the V-shaped pit generation layer 31 may be formed at a temperature of 1,000° C. to 1,300° C., a pressure of 50 mbar to 100 mbar, an Al molar ratio of 50 umole to 300 umole, and a V/III ratio of 30 to 200 or 800 to 5,000. When the V-shaped pit generation layer 31 is formed in single or multi-pair, the V-shaped pit generation layer 31 may be formed at a V/III ratio of 800 to 3,000 under the same conditions. The dislocation filtering layer 20c (for example, a single or multi-pair of $Al_mGa_{1-m}N/Al_sGa_{1-s}N$ (n<m<s≤1)) serves to reduce the number of a large amount of threading dislocations generated due to differences in lattice constant and thermal expansion coefficient between the growth substrate 10 and an AlN material. In particular, a main function of the dislocation filtering layer 20c is to suppress open core dislocations propagating in a direction parallel to a growth direction. The first spacer layer 32 (for example, undoped $Al_pGa_{1-p}N$ (0.5<p) having a thickness of 20 nm to 60 nm and the second spacer layer 52 (for example, undoped $Al_qGa_{1-q}N$ (p<q) having a thickness of 10 nm to 50 nm) are preferably undoped with dopants (Si and Mg) in general and serve to improve performance and reliability by suppressing a material from diffusing into the active region 40 when dopants (Si and Mg) of first semiconductor region sides 30 and 31 and second semiconductor region sides 50 and 60 are grown or driven for a long time. The first hole injection layer 60*a* (for example, a single layer of p-type $Al_iGa_{1-i}N$ ($x<i<h$) or a single or multi-pair of p-type $Al_iGa_{1-i}N/Al_vGa_{1-v}N$ ($x<i<v\ll h$)) is a layer that fills the V-shaped pit V and serves to smoothly supply holes to a well layer positioned below the active region 40 through the V-shaped pit V. Generally, in a MQWS, a lowermost well layer and a barrier layer are referred to as a first well and a barrier, and an uppermost well layer and a barrier layer are referred to as a last well and a barrier. When the V-shaped pit V is not present, light emission of a semiconductor light-emitting element is mainly performed in the last well and a well layer adjacent thereto. However, when the V-shaped pit V is formed from below the active region 40, holes are smoothly supplied to the first well and a well layer adjacent thereto to emit light, and thus the V-shaped pit V is an essential element for implementing a high-output deep ultraviolet light-emitting semiconductor element. The second hole injection layer 60*b* (for example, a single layer of p-type $Al_kGa_{1-k}N$ ($x<k<i$) or a single or multi-pair of p-type $Al_kGa_{1-k}N/Al_wGa_{1-w}N$ ($x<k<w<i$)) serves to facilitate current spreading over the entire second semiconductor region 60.

FIG. 24 shows images showing a degree by which a V-shaped pit is formed according to a doping concentration and shows that the V-shaped pit is not well formed when a doping concentration is $5\times10^{18}/cm^3$ or less. FIG. 24A is an image when a doping concentration is $2\times10^{17}/cm^3$, FIG. 24B is an image when a doping concentration is $1\times10^{18}/cm^3$, FIG. 24C is an image when a doping concentration is $6\times10^{18}/cm^3$, and FIG. 24D is an image when a doping concentration is $2\times10^{19}/cm^3$.

FIGS. 41 and 42 are views illustrating an example of a method of manufacturing a semiconductor light-emitting element according to the present disclosure. Referring to FIG. 41, a plurality of semiconductor light-emitting regions 30, 40, and 50 are bonded onto one support substrate 101. Each of the semiconductor light-emitting regions 30, 40, and 50 is provided on a substrate 10, a buffer region 20 and a sacrificial layer 21 are provided between the substrate 10 and the semiconductor light-emitting regions 30, 40, and 50, and a conductive bonding structure 98 is provided at a side opposite thereto to supply power to the semiconductor light-emitting regions 30, 40, and 50 and also provide bonding. Unlike those shown in FIG. 32, the substrate 10, the buffer region 20, the sacrificial layer 21, the semiconductor light-emitting regions 30, 40, and 50, and the conductive bonding structure 98 are not in a wafer state but are individualized from a wafer through a sawing process such as a scribing and/or breaking process. The substrate 10, the buffer region 20, the sacrificial layer 21, the semiconductor light-emitting regions 30, 40, and 50, and the conductive bonding structure 98 are referred to as semiconductor light-emitting dies A and B. As will be described below, in the present disclosure, the semiconductor light-emitting dies A and B are different from a semiconductor light-emitting chip A shown in FIG. 30 in that both electrodes 800 and 900 are not exposed. That is, in the present disclosure, the semiconductor light-emitting dies A and B are distinguished from the semiconductor light-emitting chip (see FIG. 30) and a semiconductor light-emitting wafer (see FIG. 32) and are distinguished from a semiconductor light-emitting chip in which two electrodes are formed and exposed to the outside. Meanwhile, the semiconductor light-emitting dies A and B are distinguished from a semiconductor light-emitting wafer in which electrodes have not yet been formed, or a substrate is not separated through a process such as a scribing and/or breaking process although electrodes are formed. The semiconductor light-emitting dies A and B may have a state in which only one electrode is formed (see FIG. 43) or a form in which only one electrode is exposed to the outside although two electrodes are formed (see FIG. 45).

Hereinafter, the semiconductor light-emitting die A will be mainly described.

The support substrate 101 has a first electrical path 91 and a second electrical path 92, and a bonding layer 90 is provided on the first electrical path 91. The semiconductor light-emitting die A is bonded onto the bonding layer 90 provided on the first electrical path 91, and the bonding layer 90 is designed such that an entire bonding surface of the semiconductor light-emitting die A is tightly placed on the bonding layer 90. The bonding layer 90 and the conductive bonding structure 98 are used for bonding. Through such a configuration, unlike the semiconductor light-emitting element shown in FIGS. 30 and 31, a gap between the semiconductor light-emitting die A and the support substrate 101 can be removed without difficulty in electrode alignment and without a separate underfill material U. Unlike a semiconductor light-emitting element shown in FIGS. 32 to 36, the semiconductor light-emitting element can be manufactured without difficulty in removing the sticky bonding layer 90 on the second electrical path 92.

The substrate 10 is typically a growth substrate, but it is not excluded that the substrate 10 is a support substrate from which a growth substrate is removed and which is attached through wafer bonding. The support substrate is different from the support substrate 101 in that the first electrical path 91 and the second electrical path 92 are not formed. For the substrate 10, sapphire (single crystal $Al_2O_3$), sintered or polycrystallized alumina ($Al_2O_3$), single crystal or polycrystallized aluminum nitride (AlN), single crystal silicon carbide (SiC), single crystal Si, or the like may be used.

The semiconductor light-emitting regions 30, 40, and 50 may include a first conductive region 30, an active region 40, and a second conductive region 50, and a structural material thereof may vary according to a wavelength of light emitted from the active region 40. According to whether visible light (green or blue) or ultraviolet light (ultraviolet A (UVA), ultraviolet B (UVB), or ultraviolet C (UVC) is emitted, an amount of Al, In, and Ga of a group III nitride semiconductor may be appropriately adjusted to form the semiconductor light-emitting regions 30, 40, and 50. Furthermore, the semiconductor light-emitting regions 30, 40, and 50 may be made of a group III phosphide semiconductor and/or a group III arsenide semiconductor which emits red light and infrared light.

A material for forming the buffer region 20 may be selected according to the active region 40 that determines a wavelength of light, and for example, when the active region 40 emits light having a UVB or UVC peak wavelength, the buffer region 20 may include a seed layer and a thick AlN layer (with a thickness of average about 3 μm) having air voids.

The sacrificial layer 21 is a layer for isolating the substrate 10 and the semiconductor light-emitting regions 30, 40, and 50 in an LLO process. The sacrificial layer 21 may be formed as a single or multi-layer of $Al_xGa_{1-x}N$ ($0\leq x\leq 1$). When the substrate 10 is isolated and removed through a laser in an operation of removing the substrate 10 in a subsequent process, a multi-layered structure is more preferable than a single layer capable of more effectively absorb a laser beam. As an example, the multi-layered structure is formed as at least two or more layers made of $Al_xGa_{1-x}N$ ($0 \leq x \leq 1$) and $Al_yGa_{1-y}N$ ($0 \leq y \leq 1$).

The conductive bonding structure 98 will be described below along with a detailed example of the semiconductor light-emitting die A.

A material of the bonding layer 90 is not limited as long as the material is an electrically conductive material, but a material on which a soldering process (bonding at less than 400° C.) or a brazing process (bonding at 400° C. or more) can be performed is preferentially selected. Representative material examples include PdIn, AgIn, AuSn, NiSn, CuSn, AuSi, AuGe, porous noble metal, Cu, and the like.

For the support substrate 101, sapphire (single crystal $Al_2O_3$), sintered or polycrystallized alumina ($Al_2O_3$), sintered or polycrystallized silicon nitride ($SiN_x$), sintered or polycrystallized aluminum nitride (AlN), single crystal or polycrystalline electrically insulating silicon carbide (SiC), single crystal or polycrystalline electrically insulating diamond, or the like, which has an electrical insulating property and high thermal stability, is preferable.

The first electrical path 91 and the second electrical path 92 may be formed through a process of, after forming through-holes in the support substrate 101 having an electrical insulating property and high thermal stability, depositing an adhesion-strengthening layer material through a PVD process and filling the through-holes with a copper (Cu) material through an electro or electroless plating process that is a subsequent process. It is preferable that the adhesion-strengthening layer material through the PVD process is deposited into at least two layers using Ti, Cr, Ni, Pd, Au, Cu, or the like.

Preferably, conductive pads 120 and 121 are provided on a lower surface 104 of the support substrate 101 to correspond to the first electrical path 91 and the second electrical path 92, respectively.

Reference numeral 103 denotes an upper surface of the support substrate 101.

Next, as shown in FIG. 42, the substrate 10 is removed through an LLO process, and residues are removed to leave only the semiconductor light-emitting regions 30, 40, and 50. An insulating layer 110 is formed through a passivation process, and an electrical connection 93, which electrically connects the second electrical path 92 and the semiconductor light-emitting region 30, 40, and 50, is formed through electrode deposition rather than wire bonding, thereby completing a semiconductor light-emitting element including a non-wire-bonded semiconductor light-emitting chip. According to a required specification, the support substrate 101 may be sawn to provide one semiconductor light-emitting die A or provide a plurality of semiconductor light-emitting dies A. If necessary, a process of partially removing the semiconductor light-emitting regions 30, 40, and 50 through an etching process, reducing a thickness, or forming a rough surface for light scattering may be performed. As described above, for stable bonding of the insulating layer 110 and the bonding layer 90, an uppermost layer of the bonding layer 90 may be made of a metal such as such as Ti, Cr, Ni, V, or W having high adhesion with the insulating layer 110. Prior to the formation of the insulating layer 110, it is also preferable that oxygen ($O_2$) plasma treatment or annealing treatment in an oxygen ($O_2$) atmosphere is performed to strengthen adhesion with the insulating layer 110. As a material of the high-quality insulating layer 110 which performs a passivation function and is absolutely necessary for preventing an electrical short circuit, a metal oxide or nitride having a high withstand voltage, such as $SiO_2$, $SiN_x$, $Al_2O_3$, $Cr_2O_3$, or $TiO_2$, is preferable. The materials may be formed through a CVD method such as a plasma enhanced chemical vapor deposition (PECVD) or atomic layer deposition (ALD) method or a PVD method such as a sputtering or pulsed laser (PLD) method. A more preferred process is a process of performing spin-coating on a liquid state spin-on glass (SOG) or flowable oxide ($FO_x$) material including a $SiO_2$ material to form the insulating layer 110 through a curing process. A spin coating process in a liquid state has a great advantage in forming the insulating layer 110 that is not broken and is capable of filling a gap. In the present disclosure, SOG and $FO_x$ materials are classified according to a content of a carbon component. In general, a liquid $SiO_2$ insulating layer that has no carbon component is referred to as $FO_x$.

Subsequent processes are not different from processes shown in FIGS. 37 to 15, and a semiconductor light-emitting wafer state shown in FIGS. 37 to 39 may be sawn and used as the semiconductor light-emitting die according to the present disclosure.

FIGS. 43 and 44 are views illustrating a specific example of a semiconductor light-emitting element according to the present disclosure. For convenience of description, a process of converting a semiconductor light-emitting die A in a state of being bonded to a support substrate 101 (not shown) into a chip form (a process of forming an electrical connection 93) is shown. First, as shown in FIG. 43A, the semiconductor light-emitting die A is provided. The semiconductor light-emitting die A includes a substrate 10, a buffer region 20, a sacrificial layer 21, semiconductor light-emitting regions 30, 40, and 50, an insulating layer 111, and a conductive bonding structure 98. The conductive bonding structure 98 is in electrical communication with the semiconductor light-emitting regions 30, 40, and 50 through an opening formed in the insulating layer 111. In the shown example, the conductive bonding structure 98 is electrically connected to a second semiconductor region 50. The conductive bonding structure 98 includes a first conductive layer 94 and a second conductive layer 95. The first conductive layer 94 serves as an electrode for the second semiconductor region 50 and also serves as a reflective film. The first conductive layer 94 may be made of a material such as Rh and Ni/Au for UVB and UVC and has a structure of Ag, Ni/Ag, ITO/Ag, or ITO/distributed Bragg reflector (DBR) for visible light and UVA. Preferably, the first conductive layer 94 further includes a diffusion barrier layer made of Ti, Ni, Cr, V, Pt, W, TiW, TiN, CrN, or VN in order to block material diffusion between the first conductive layer 94 and the second conductive layer 95. The second conductive layer 95 may provide a function of bonding with a bonding layer 90 and may be made of a material such as AuSn, NiSn, CuSn, PdIn, Au, Ag, or Cu. Next, as shown in FIG. 43B, the substrate 10 is removed, residues are removed through an etching process, a thickness of a first semiconductor region 30 is reduced, and the insulating layer 111 (for example, $SiO_2$) is exposed. Then, as shown in FIG. 43C, an insulating layer 110 is formed, and it is important that the insulating layer 110 is formed to be connected directly to the exposed insulating layer 111. Since both the insulating layer 110 and the insulating layer 111 are made of an insulating material, a connection thereof can be structurally stable, and an electrical short circuit can be reliably prevented. In order to distinguish two insulating layers 110 and 111, the insulating layer 110 may be referred to as a first passivation layer.

Next, as shown in FIG. 43C, the insulating layer 110 is formed. Preferably, as shown in FIG. 43D, a substrate removal surface 31 having a rough surface for light scattering is formed in the first semiconductor region 30. Then, as shown in FIG. 43E, an electrical connection 93 is formed. The electrical connection 93 leads to the first semiconductor region 30. The electrical connection 93 formed through an upper portion of the first passivation layer or insulating layer 110 may be usually formed through a PR photo lithography & metal deposition process which is a semiconductor wafer fabrication process. The electrical connection 93 may be formed in a multi-layered structure made of Cr, Ti, Ni, V, Al, Pt, Au, Cu, or the like. If necessary, as shown in FIG. 43F, a second passivation layer or insulating layer 112 for passivating the electrical connection 93 is formed.

FIG. 45 shows views illustrating another specific example of a semiconductor light-emitting element according to the present disclosure. First, as shown in FIG. 45A, a semiconductor light-emitting die A is provided. The semiconductor light-emitting die A includes a substrate 10, a buffer region 20, a sacrificial layer 21, semiconductor light-emitting regions 30, 40, and 50, a first conductive layer 94, an insulating isolation film or insulating layer 113, an insulating layer 114, and a conductive bonding structure 98. If necessary, an electrically conductive capping layer 114 may be added to prevent degradation of electrical properties of the first conductive layer 94. Unlike that shown in FIG. 43A, the conductive bonding structure 98 includes a second conductive layer 95 and a third conductive layer 99. The second conductive layer 95 is in electrical communication with the third conductive layer 99 through an opening V formed to pass through the insulating isolation film or insulating layer 113. The third conductive layer 99 may be formed in the form of Cr/Ti/Al/Ni/Au and may be made of a combination of a metal (Cr or Ti) having a high contact force, a barrier metal (Ti, Ni, or Pt), a metal (Al) having excellent reflectivity, and a metal (Au) having high bonding strength. Next, as shown in FIG. 45B, the substrate 10 is removed, residues are removed through an etching process, a thickness of a first semiconductor region 30 is reduced, and an insulating layer 111 (for example, SiO) is exposed. Then, as shown in FIG. 45C, in the same manner shown in FIG. 43D, a substrate removal surface 31 having a rough surface for light scattering is formed in the first semiconductor region 30, and then a first passivation layer or insulating layer 110 is formed to be connected directly to the exposed insulating layer 111. Next, as shown in FIG. 45D, an electrical connection 93 is formed to communicate with the electrically conductive capping layer 114 and/or the first conductive layer 94 exposed by removing the first passivation layer or insulating layer 110, the insulating layer 111, and the insulating isolation film or insulating layer 113. Although the first conductive layer 94 and the electrical connection 93 are not connected to each other in FIG. 45D, the first conductive layer 94 and the electrical connection 93 are electrically connected to each other as shown in FIG. 37. If necessary, as shown in FIG. 43F, an insulating layer 112 for passivating the electrical connection 93 may be formed.

Hereinafter, various embodiments of the present disclosure will be described.

(1) An ultraviolet light-emitting semiconductor element including a plurality of semiconductor regions which include a first semiconductor region which is grown using a growth substrate and has first conductivity, a second semiconductor region having second conductivity different from the first conductivity, and an active region interposed between the first semiconductor region and the second semiconductor region and configured to emit ultraviolet light through recombination of electrons and holes, a high temperature grown $Al_xGa_{1-x}N$ (0.5≤x≤1) layer provided below the first semiconductor region, and an ID and IDB suppression layer provided between the growth substrate and the high temperature grown $Al_xGa_{1-x}N$ (0.5≤x≤1) layer.

(2) An ultraviolet light-emitting semiconductor element including a first high temperature grown AlN layer provided between a growth substrate and an ID and IDB suppression layer, and a low temperature grown AlN layer provided between the ID and IDB suppression layer and a high temperature grown $Al_xGa_{1-x}N$ (0.5≤x≤1) layer.

(3) An ultraviolet light-emitting semiconductor element including a first high temperature grown AlN layer provided between a growth substrate and an ID and IDB suppression layer, a low temperature grown AlN layer provided between the ID and IDB suppression layer and a high temperature grown $Al_xGa_{1-x}N$ (0.5≤x≤1) layer, and a second high temperature grown AlN layer.

(4) An ultraviolet light-emitting semiconductor element including a sacrificial layer configured to remove a growth substrate between the growth substrate and a high temperature grown $Al_xGa_{1-x}N$ (0.5≤x≤1) layer.

(5) An ultraviolet light-emitting semiconductor element including a first high temperature grown AlN layer provided between a growth substrate and an ID and IDB suppression layer, a sacrificial layer configured to remove the growth substrate, a low temperature grown AlN layer provided between the ID and IDB suppression layer and a high temperature grown $Al_xGa_{1-x}N$ (0.5≤x≤1) layer, and a second high temperature grown AlN layer.

(6) An ultraviolet light-emitting semiconductor element including a first high temperature grown AlN layer provided between a growth substrate and an ID and IDB suppression layer, a low temperature grown AlN layer provided between the ID and IDB suppression layer and a high temperature grown $Al_xGa_{1-x}N$ (0.5≤x≤1) layer, a sacrificial layer configured to remove the growth substrate, and a second high temperature grown AlN layer.

(7) An ultraviolet light-emitting semiconductor element including a sacrificial layer provided between a growth substrate and an ID and IDB suppression layer and configured to remove the growth substrate, a low temperature grown AlN layer provided between the ID and IDB suppression layer and a high temperature grown $Al_xGa_{1-x}N$ (0.5≤x≤1) layer, and a first high temperature grown AlN layer.

(8) An ultraviolet light-emitting semiconductor element including a low temperature grown AlN layer provided between an ID and IDB suppression layer and a high temperature grown $Al_xGa_{1-x}N$ (0.5≤x≤1) layer, a sacrificial layer configured to remove a growth substrate, and a first high temperature grown AlN layer.

(9) An ultraviolet light-emitting semiconductor element including a plurality of semiconductor regions which include a first semiconductor region which is grown using a growth substrate and has first conductivity, a second semiconductor region having second conductivity different from the first conductivity, and an active region interposed between the first semiconductor region and the second semiconductor region and configured to emit ultraviolet light through recombination of electrons and holes, an $Al_xGa_{1-x}N$ (0.5≤x≤1) layer which is provided in the first semiconductor region at a side opposite to the active region and is intentionally undoped, a support substrate provided at a side of the second semiconductor region and configured to support the plurality of semiconductor regions from which the growth substrate is removed, and a bonding layer configured to bond the plurality of semiconductor regions and the support substrate.

(10) An ultraviolet light-emitting semiconductor element including a first electrical path which passes through a support substrate and is electrically connected to a first semiconductor region through a bonding layer, and a first electrical path which passes through the support substrate and is electrically connected to a second semiconductor region through a first electrical connection.

(11) An ultraviolet light-emitting semiconductor element including a first electrical path which passes through a support substrate and is electrically connected to a second semiconductor region through a bonding layer, and a first electrical path which passes through the support substrate and is electrically connected to a first semiconductor region through a first electrical connection.

(12) An ultraviolet light-emitting semiconductor element including a first electrical connection provided as a wire bonding pad at a side opposite to a support substrate with respect to a bonding layer and electrically connected to a second semiconductor region, and a second electrical connection provided as a wire bonding pad at a side opposite to the support substrate with respect to the bonding layer and electrically connected to a first semiconductor region through the bonding layer.

(13) An ultraviolet light-emitting semiconductor element including a first electrical connection provided as a wire bonding pad at a side opposite to a support substrate with respect to a bonding layer and electrically connected to a second semiconductor region, and a second electrical connection which is provided as a wire bonding pad at a side opposite to the support substrate with respect to the bonding layer and passes through an intentionally undoped $Al_xGa_{1-x}N$ $(0.5 \leq x \leq 1)$ layer to be electrically connected to a first semiconductor region.

(14) A method of manufacturing the ultraviolet light-emitting semiconductor element.

(15) An ultraviolet light-emitting semiconductor element including a plurality of semiconductor regions which include a first semiconductor region which is grown using a growth substrate and has first conductivity, a second semiconductor region having second conductivity different from the first conductivity, and an active region interposed between the first semiconductor region and the second semiconductor region and configured to emit ultraviolet light through recombination of electrons and holes, a first AlN layer grown on the growth substrate, a stress adjustment layer, a second AlN layer provided below the first semiconductor region, a first AlGaN region which is provided as multiple layers between the first AlN layer and the stress adjustment layer, has an aluminum (Al) composition difference of less than 20% from the first AlN layer at a side thereof in contact with the first AlN layer, and has an aluminum (Al) composition difference of less than 20% from the stress adjustment layer at a side thereof in contact with the stress adjustment layer and in which each of the multiple layers has an aluminum (Al) composition difference of less than 20%, and a second AlGaN region which is provided as multiple layers between the stress adjustment layer and the second AlN layer, has an aluminum (Al) composition difference of less than 20% from the stress adjustment layer at a side thereof in contact with the stress adjustment, and has an aluminum (Al) composition difference of less than 20% from the second AlN layer at a side thereof in contact with the second AlN layer and in which each of the multiple layers has an aluminum (Al) composition difference of less than 20%.

(16) The stress adjustment layer is a sacrificial layer.

(17) The ultraviolet light-emitting semiconductor element include an $Al_xGa_{1-x}N$ $(0.5 \leq x \leq 1)$ layer provided between the second AlN layer and the first semiconductor region.

(18) The ultraviolet light-emitting semiconductor element includes an ID and IDB suppression layer provided between the first AlN layer and the first AlGaN region.

(19) A decreased aluminum composition of the first AlGaN region and an increased aluminum composition of the second AlGaN region are symmetric to each other.

(20) An ultraviolet light-emitting semiconductor element including a plurality of semiconductor regions which include a first semiconductor region which is grown using a growth substrate and has first conductivity, a second semiconductor region having second conductivity different from the first conductivity, and an active region interposed between the first semiconductor region and the second semiconductor region and configured to emit ultraviolet light through recombination of electrons and holes, a first AlN layer grown on the growth substrate, a stress adjustment layer, an $Al_xGa_{1-x}$ N $(0.5 \leq x \leq 1)$ layer provided below the first semiconductor region, a first AlGaN region which is provided as multiple layers between the first AlN layer and the stress adjustment layer, has an aluminum (Al) composition difference of less than 20% from the first AlN layer at a side thereof in contact with the first AlN layer, has an aluminum (Al) composition difference of less than 20% from the stress adjustment layer at a side thereof in contact with the stress adjustment layer and in which each of the multiple layers has an aluminum (Al) composition difference of less than 20%, and a second AlGaN region which is provided as multiple layers between the stress adjustment layer and the $Al_xGa_{1-x}N$ $(0.5 \leq x \leq 1)$ layer, has an aluminum (Al) composition difference of less than 20% from the stress adjustment layer at a side thereof in contact with the stress adjustment layer, and has an aluminum (Al) composition difference of less than 20% from the $Al_xGa_{1-x}N$ $(0.5 \leq x \leq 1)$ layer at a side thereof in contact with the $Al_xGa_{1-x}N$ $(0.5 \leq x \leq 1)$ layer and in which each of the multiple layers has an aluminum (Al) composition difference of less than 20%.

(21) The ultraviolet light-emitting semiconductor element includes an ID and IDB suppression layer provided between the first AlN layer and the first AlGaN region.

(22) A method of manufacturing an aluminum nitride template, the method including providing a growth substrate, growing an $Al_{1-v-w}Ga_vIn_wN$ $(0 \leq v < 1, 0 \leq w < 1,$ and $v+w < 1)$ layer on the growth substrate, performing etching to decompose and evaporate gallium (Ga) and indium (In) in the $Al_{1-v-w}Ga_vIn_wN$ $(0 \leq v < 1, 0 \leq w < 1,$ and $v+w < 1)$ layer such that the $Al_{1-v-w}Ga_vIn_wN$ $(0 \leq v < 1, 0 \leq w < 1,$ and $v+w < 1)$ layer becomes a porous $Al_{1-v-w}Ga_vIn_wN$ $(0 \leq v < 1, 0 \leq w < 1,$ and $v+w < 1)$ layer having a plurality of voids, and growing an AlN layer on the porous $Al_{1-v-w}Ga_vIn_wN$ ($0 \leq v < 1$, $0 \leq w < 1$, and $v+w < 1$) layer.

23) Prior to the growing of the AlN layer, the growing of the $Al_{1-v-w}Ga_vIn_wN$ ($0 \leq v < 1$, $0 \leq w < 1$, and $v+w < 1$) layer and the etching are repeated multiple times.

(24) The growing of the $Al_{1-v-w}GavIn_wN$ ($0 \leq v < 1$, $0 \leq w < 1$, and $v+w < 1$) layer, the etching, and the growing of the AlN layer are repeated multiple times.

(25) The method further includes, prior to the growing of the $Al_{1-v-w}Ga_vIn_wN$ ($0 \leq v < 1$, $0 \leq w < 1$, and $v+w < 1$) layer, forming a seed layer on a substrate.

(26) The $Al_{1-v-w}Ga_vIn_wN$ ($0 \leq v < 1$, $0 \leq w < 1$, and $v+w < 1$) layer is an $Al1-vGa_vN$ ($0 < v < 1$) layer.

(27) Before an $n^{th}$ grown AlN layer, first to the $(n-1)^{th}$ grown AlN interlayers have a thickness of 100 nm or less.

(28) A method of manufacturing an ultraviolet light-emitting semiconductor element including a plurality of semiconductor regions which include a first semiconductor region which is grown using a growth substrate and has first conductivity, a second semiconductor region having second conductivity different from the first conductivity, and an active region interposed between the first semiconductor region and the second semiconductor region and configured to emit ultraviolet light having a peak wavelength of 320 nm or less through recombination of electrons and holes, the method including growing the first semiconductor region, growing a V-shaped pit generation layer having a V-shaped pit on the first semiconductor region at a growth temperature of 1,000° C. or more and a doping concentration in a range of $6 \times 10^{18}/cm^3$ to $5 \times 10^{19}/cm^3$, growing the active region while maintaining the V-shaped pit, and growing the second semiconductor region on the active region.

(29) The V-shaped pit generation layer has a thickness of 50 nm to 500 nm.

(30) The V-shaped pit generation layer is made of AlN.

(31) The V-shaped pit generation layer has a total Al content of 50% or more.

(32) The method further includes, prior to the growing of the active region, growing a first spacer layer configured to prevent a dopant of the V-shaped pit generation layer doped at a doping concentration in a range of $6 \times 10^{18}/cm^3$ to $5 \times 10^{19}/cm^3$ from diffusing into the active region.

(33) A method of manufacturing a semiconductor light-emitting element through non-wire bonding, the method including providing a semiconductor light-emitting die which is individualized from a wafer state and includes a substrate, a plurality of semiconductor regions (including a first semiconductor region having first conductivity, an active region configured to generate light through recombination of electrons and holes, and a second semiconductor region having second conductivity different from the first conductivity), and a conductive bonding structure electrically connected to one of the first semiconductor region and the second semiconductor region and formed on the entirety of the second semiconductor region, and providing a support substrate which has an upper surface and a lower surface and includes a first electrical path and a second electrical path leading from the upper surface to the lower surface and a bonding layer configured to cover the first electrical path on the upper surface and electrically connected thereto, attaching the semiconductor light-emitting die to the support substrate in a state in which the second electrical path is exposed such that the conductive bonding structure covering the entirety of the second semiconductor region is tightly bonded to the bonding layer, removing the substrate, and electrically connecting the second electrical path to the other one of the first semiconductor region and the second semiconductor region through deposition using an electrical connection.

(34) The conductive bonding structure includes a first conductive layer in ohmic contact with the second semiconductor region and a second conductive layer bonded to the bonding layer.

(35) The conductive bonding structure includes a third conductive layer in ohmic contact with the first semiconductor region and a second conductive layer bonded to the bonding layer.

(36) The semiconductor light-emitting die includes an insulating layer, which is exposed after the substrate is removed, between the second semiconductor region and the second conductive layer.

(37) The method further includes, prior to the electrical connecting, forming a first passivation layer configured to cover the bonding layer through the insulating layer from above the plurality of semiconductor regions.

(38) The method further includes, prior to the forming of the first passivation layer, performing oxygen ($O_2$) plasma treatment on the bonding layer or performing annealing treatment thereon in an oxygen ($O_2$) atmosphere.

(39) The first passivation layer is formed by performing spin coating on a flowable oxide ($FO_x$) material including a $SiO_2$ material.

According to an ultraviolet light-emitting semiconductor element according to the present disclosure, it is possible to suppress an IDB.

In addition, according to an ultraviolet light-emitting semiconductor element according to the present disclosure, it is possible to manufacture a semiconductor chip using an IDB suppression structure.

In addition, according to an ultraviolet light-emitting semiconductor element according to the present disclosure, it is possible to manufacture an ultraviolet light-emitting semiconductor element in which crystalline defects of an element are reduced.

In addition, according to a method of manufacturing an aluminum nitride template according to the present disclosure, it is possible to manufacture an aluminum nitride template having no crack and having a low density of crystalline defects.

According to an ultraviolet light-emitting semiconductor element according to the present disclosure, it is possible to actually implement an ultraviolet light-emitting semiconductor element having a V-shaped pit.

According to a method of manufacturing a semiconductor light-emitting element according to the present disclosure, unlike the semiconductor light-emitting element shown in FIGS. 30 and 31, a gap between a semiconductor light-emitting die A and a support substrate 101 can be removed without difficulty in electrode alignment and without a separate underfill material U. Unlike the semiconductor light-emitting elements shown in FIGS. 32 to 36, a semiconductor light-emitting element can be manufactured without difficulty in removing a sticky bonding layer 90 on a second electrical path 92.

What is claimed is:

1. A method of manufacturing a semiconductor light-emitting element through non-wire bonding, the method comprising:

providing a semiconductor light-emitting die which is individualized from a wafer state and includes a substrate, a plurality of semiconductor regions (including a first semiconductor region having first conductivity, an active region configured to generate light through recombination of electrons and holes, and a second semiconductor region having second conductivity different from the first conductivity), and a conductive bonding structure electrically connected to one of the first semiconductor region and the second semiconductor region and formed on an entirety of the second semiconductor region;

providing a support substrate which has an upper surface and a lower surface and includes a first electrical path and a second electrical path leading from the upper surface to the lower surface and has a bonding layer configured on the upper surface of the support substrate so as to cover the first electrical path except for the second electrical path;

attaching the semiconductor light-emitting die to the support substrate in a state in which the second electrical path is exposed on the upper surface of the support substrate such that the conductive bonding structure covering the entirety of the second semiconductor region is tightly bonded to the bonding layer;

removing the substrate;

electrically connecting the second electrical path to the other one of the first semiconductor region and the second semiconductor region through deposition using an electrical connection;

prior to the electrically connecting the second electrical path to the other one of the first semiconductor region and the second semiconductor region through deposition, forming a first passivation layer configured to cover the bonding layer through the insulating layer from above the plurality of semiconductor regions; and prior to the forming of the first passivation layer, performing oxygen (O2) plasma treatment on the bonding layer or performing annealing treatment thereon in an oxygen (O2) atmosphere, wherein the semiconductor light-emitting die includes an insulating layer, which is exposed after the substrate is removed, between the second semiconductor region and the second conductive layer, wherein the conductive bonding structure includes a first conductive layer in ohmic contact with the second semiconductor region and a second conductive layer bonded to the bonding layer.

2. The method of claim 1, wherein the conductive bonding structure includes:

a third conductive layer in ohmic contact with the first semiconductor region.

3. The method of claim 1, wherein the first passivation layer is formed by performing spin coating on a flowable oxide (FOx) material including a SiO2 material.

4. The method of claim 2, wherein the first passivation layer is formed by performing spin coating on a flowable oxide (FOx) material including a SiO2 material.

* * * * *